(12) United States Patent
O et al.

(10) Patent No.: US 10,019,367 B2
(45) Date of Patent: Jul. 10, 2018

(54) MEMORY MODULE, COMPUTING SYSTEM HAVING THE SAME, AND METHOD FOR TESTING TAG ERROR THEREOF

(71) Applicant: Samsung Electronics Co., Ltd., Suwon-si, Gyeonggi-do (KR)

(72) Inventors: Seongil O, Suwon-si (KR); Chankyung Kim, Hwaseong-si (KR); Jongpil Son, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/479,795

(22) Filed: Apr. 5, 2017

(65) Prior Publication Data

US 2017/0206028 A1 Jul. 20, 2017

Related U.S. Application Data

(63) Continuation-in-part of application No. 15/354,354, filed on Nov. 17, 2016.

(30) Foreign Application Priority Data

Dec. 14, 2015 (KR) .......................... 10-2015-0178365
May 20, 2016 (KR) .......................... 10-2016-0062280

(51) Int. Cl.
| | | |
|---|---|---|
| *G06F 12/08* | (2016.01) | |
| *G06F 12/0846* | (2016.01) | |
| *G06F 12/128* | (2016.01) | |
| *G06F 12/0844* | (2016.01) | |
| *G06F 12/0884* | (2016.01) | |

(52) U.S. Cl.
CPC ...... *G06F 12/0846* (2013.01); *G06F 12/0844* (2013.01); *G06F 12/0884* (2013.01); *G06F 12/128* (2013.01)

(58) Field of Classification Search
CPC ............ G11C 7/1072; G11C 11/40607; G11C 11/4092; G11C 11/4096; G11C 14/0018; G11C 16/0483; G06F 12/0846; G06F 12/0844; G06F 12/0884; G06F 12/128
See application file for complete search history.

(56) References Cited

U.S. PATENT DOCUMENTS

| | | | |
|---|---|---|---|
| 5,014,195 A | | 5/1991 | Farrell et al. |
| 5,175,833 A | * | 12/1992 | Yarkoni .............. G06F 12/0864 711/119 |
| 5,577,223 A | | 11/1996 | Tanoi et al. |
| 5,682,515 A | | 10/1997 | Lau et al. |
| 5,860,127 A | | 1/1999 | Shimazaki et al. |
| 6,000,013 A | | 12/1999 | Lau et al. |
| 6,425,056 B2 | | 7/2002 | Meyer |
| 6,463,506 B1 | | 10/2002 | McAllister et al. |
| 6,912,628 B2 | | 6/2005 | Wicki et al. |
| 7,051,166 B2 | | 5/2006 | Sharma |
| 7,679,133 B2 | | 3/2010 | Son et al. |

(Continued)

*Primary Examiner* — Vanthu Nguyen
(74) *Attorney, Agent, or Firm* — Myers Bigel, P.A.

(57) ABSTRACT

A method includes outputting, at a processor, a command and an address to the memory module, receiving match/unmatch bits indicating results of comparing a tag corresponding to the address with tags stored in the memory module, from the memory module, determining, at the processor, a cache hit/miss from the match/unmatch bits by using majority voting, and outputting, at the processor, the determined cache hit/miss to the memory module.

20 Claims, 33 Drawing Sheets

(56) References Cited

U.S. PATENT DOCUMENTS

| | | | |
|---|---|---|---|
| 7,827,348 B2 | 11/2010 | Lee et al. | |
| 7,830,732 B2 * | 11/2010 | Moshayedi | G11C 5/04 365/189.17 |
| 8,082,482 B2 | 12/2011 | Gower et al. | |
| 8,134,875 B2 | 3/2012 | Baxter | |
| 8,553,466 B2 | 10/2013 | Han et al. | |
| 8,559,235 B2 | 10/2013 | Yoon et al. | |
| 8,572,320 B1 | 10/2013 | Maheshwari | |
| 8,607,121 B2 | 12/2013 | Moyer | |
| 8,654,587 B2 | 2/2014 | Yoon et al. | |
| 8,806,294 B2 * | 8/2014 | Ramaraju | G06F 11/1064 714/10 |
| 8,838,897 B2 * | 9/2014 | Hu | G06F 12/0846 711/108 |
| 8,874,831 B2 | 10/2014 | Lee et al. | |
| 8,935,481 B2 | 1/2015 | Maybee et al. | |
| 9,043,552 B2 | 5/2015 | Zhou et al. | |
| 9,317,429 B2 | 4/2016 | Ramanujan et al. | |
| 9,342,453 B2 | 5/2016 | Nale et al. | |
| 9,361,250 B2 | 6/2016 | Shan et al. | |
| 9,460,791 B1 | 10/2016 | Shallal et al. | |
| 2004/0103251 A1 | 5/2004 | Alsup | |
| 2009/0313416 A1 | 12/2009 | Nation | |
| 2011/0233648 A1 | 9/2011 | Seol et al. | |
| 2012/0221785 A1 | 8/2012 | Chung et al. | |
| 2013/0138892 A1 | 5/2013 | Loh et al. | |
| 2013/0290607 A1 | 10/2013 | Chang et al. | |
| 2013/0329491 A1 | 12/2013 | Chang et al. | |
| 2014/0006696 A1 | 1/2014 | Ramanujan et al. | |
| 2014/0229655 A1 | 8/2014 | Goss et al. | |
| 2014/0365715 A1 | 12/2014 | Lee | |
| 2015/0121137 A1 | 4/2015 | McKnight et al. | |
| 2015/0255130 A1 | 9/2015 | Lee et al. | |
| 2015/0261446 A1 | 9/2015 | Lee | |
| 2016/0299719 A1 | 10/2016 | Liu et al. | |

\* cited by examiner

US 10,019,367 B2

MEMORY MODULE, COMPUTING SYSTEM HAVING THE SAME, AND METHOD FOR TESTING TAG ERROR THEREOF

CROSS-REFERENCE TO RELATED APPLICATIONS

This U.S. non-provisional patent application claims priority under 35 U.S.C. § 119 to Korean Patent Applications No. 10-2015-0178365 filed on Dec. 14, 2015, and No. 10-2016-0062280 filed on May 20, 2016, the disclosures of which are hereby incorporated by reference in their entireties. This U.S. non-provisional patent application further claims priority under 35 U.S.C. § 120 as a continuation-in-part of U.S. patent application Ser. No. 15/354,354 filed on Nov. 17, 2016.

BACKGROUND

Embodiments of the inventive concept disclosed herein relate to a memory module, a computing system having the same, and a method for testing a tag error thereof.

A nonvolatile memory compatible with various interfaces of existing computing systems is being developed. That is, there are being made attempts to use a flash memory as a data storage device or a working memory by mounting the flash memory in the same slot or channel as a main memory or working memory. In this case, compatibility with a conventionally used volatile random access memory (RAM) (e.g., a dynamic RAM (DRAM)) may provide improved data integrity and a low-power characteristic while maintaining compatibility with the volatile RAM.

SUMMARY

Embodiments of the inventive concept provide a memory module, a computing system having the same, and a method for testing a tag error thereof.

According to an aspect of some embodiments, a method of a computing system that includes at least one nonvolatile memory, a memory module performing a cache function of the nonvolatile memory, and a processor controlling the nonvolatile memory and the memory module, the method including outputting, at the processor, a command and an address to the memory module, receiving match/unmatch bits indicating results of comparing a tag corresponding to the address with tags stored in the memory module, from the memory module, determining, at the processor, a cache hit/miss from the match/unmatch bits by using majority voting, and outputting, at the processor, the determined cache hit/miss to the memory module.

According to another aspect of some embodiments, a tag error test method of a computing system that includes at least one nonvolatile memory, a memory module performing a cache function of the nonvolatile memory, and a processor controlling the nonvolatile memory and the memory module, the method includes generating, at each of a plurality of cache DRAMs of the memory module, a match/unmatch bit as a result of comparing a tag corresponding to an address and a tag stored in a respective one of the plurality of cache DRAMs, determining whether a match bit count is greater than "0" and an unmatch bit count is greater than "0", and determining a cache hit/miss from the match/unmatch bits through majority voting when the match bit count is greater than "0" and the unmatch bit count is greater than "0".

According to another aspect of some embodiments, a memory module includes a plurality of cache DRAMs that stores a tag and data corresponding to the tag, and a registered connective device that receives a command and an address and controls the cache DRAMs. Each of the cache DRAMs includes a tag comparator that compares the stored tag and a tag corresponding to the address and outputs a match/unmatch bit corresponding to the comparison result, and a buffer circuit that outputs data corresponding to the command in response to cache hit/miss information. The cache hit/miss information is a value that is determined according to majority voting on match/unmatch bits output from the cache DRAMs.

According to another aspect of some embodiments, a computing system includes a processor that generates cache hit/miss information from match/unmatch bits by using majority voting, and a memory module that is connected to the processor through a first memory channel. The memory module includes a plurality of cache DRAMs that are each configured to store a tag and data and a registered connective device that receives a command and an address and controls the cache DRAMs. Each of the cache DRAMs includes a tag comparator that compares the stored tag and a tag corresponding to the address and outputs a match/unmatch bit corresponding to the comparison result, and a buffer circuit that outputs data corresponding to the command in response to the cache hit/miss information.

According to some embodiments, a method includes receiving a command and an address at a cache memory module, the cache memory module comprising a plurality of cache memory blocks, determining cache hit/miss information based on an input tag associated with the address and a plurality of tags stored in the plurality of cache memory blocks, respectively, determining that one of the plurality of tags is different than other ones of the plurality of tags, determining whether the one of the plurality of tags that is different is correctable, and correcting the one of the plurality of tags that is different from the other ones of the plurality of tags at the cache memory device when the one of the plurality of tags that is different is determined to be correctable.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which.

DETAILED DESCRIPTION

Figure 1:
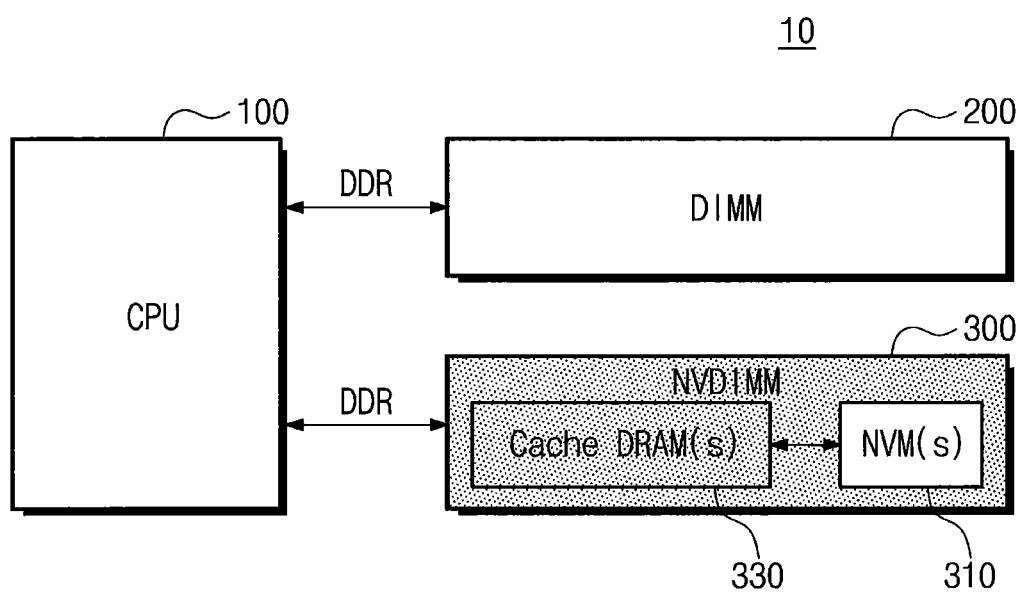
FIG. 1 is a block diagram illustrating a computing system according to some embodiments of the inventive concept.

Reference will now be made in detail to the embodiments of the present general inventive concepts, examples of which are illustrated in the accompanying drawings, wherein the reference numerals refer to like elements throughout the description. The embodiments are described below to explain the present general inventive concepts by referring to the figures.

FIG. 1 is a block diagram illustrating a computing system 10 according to some embodiments of the inventive concept. Referring to FIG. 1, the computing system 10 may include a processor (CPU) 100, at least one memory module (DIMM) 200, and at least one nonvolatile memory module (NVDIMM) 300.

In some embodiments, the computing system 10 may include, for example, one of a plurality of devices, such as a computer, a portable computer, an ultra-mobile personal computer (UMPC), a workstation, a data server, a net-book, a personal data assistant (PDA), a web tablet, a wireless phone, a mobile phone, a smart phone, an e-book, a portable multimedia player (PMP), a digital camera, a digital audio recorder/player, a digital picture/video recorder/player, a portable game machine, a navigation system, a black box, a 3D television, a device capable of transmitting and receiving information at a wireless circumstance, a wearable device, one of various electronics devices constituting a home network, one of various electronics devices constituting computer network, one of various electronics devices constituting a telematics network, a radio-frequency identification (RFID) device, one of various electronic devices constituting a computing system, or the like.

The processor 100 may control an overall operation of the computing system 10. The processor 100 may be, for example, a central processing unit (CPU), a co-processor, an arithmetic processing unit (APU), a graphics processing unit (GPU), a digital signal processor (DSP), a memory controller hub (MCH), a platform controller hub (PCH), or the like. The processor 100 may process data by performing various operations of the computing system 10. Although not illustrated in FIG. 1, the processor 100 may further include a memory management unit (MMU) for managing the memory module 200 and the nonvolatile memory module 300.

The memory module 200 may be connected to the processor 100 through, for example, a double data rate (DDR) interface. In some embodiments, the DDR interface may comply with a memory standard specification of a joint electronic device engineering council (JEDEC). The memory module 200 illustrated in FIG. 1 may be connected to the processor 100 according to the DDR interface. However, embodiments of the inventive concepts are not limited thereto. That is, the memory module 200 may be connected to the processor 100 through various kinds of communication interfaces other than the DDR interface. For example, a communication interface may be implemented using, for example, a non-volatile memory express NVMe, a peripheral component interconnect express PCIe, a serial at attachment SATA, a small computer system interface SCSI, a serial attached SCSI SAS, a universal storage bus USB attached SCSI UAS, an internet small computer system interface iSCSI, a fiber Channel, a fiber channel over Ethernet FCoE, or the like.

The memory module 200 may be, for example, a dual in-line memory module (DIMM). The memory module 200 may include at least one dynamic random access memory (DRAM). The memory module 200 may be used as a working memory of the processor 100.

The nonvolatile memory module 300 may be connected to the processor 100 through, for example, the DDR interface. The nonvolatile memory module 300 illustrated in FIG. 1 is connected to the processor 100 according to the DDR interface. However, embodiments of the inventive concept are not limited thereto. That is, the nonvolatile memory module 300 according to some embodiments of the inventive concept may be connected to the processor 100 through various kinds of communication interfaces other than the DDR interface.

The nonvolatile memory module 300 may be, for example, a dual in-line memory module (DIMM). The nonvolatile memory module 300 may be used as a working memory of the processor 100. The nonvolatile memory module 300 may include at least one nonvolatile memory (NVM(s)) 310 and at least one cache DRAM(s) 330 used as a cache of the at least one nonvolatile memory 310.

In some embodiments, the at least one nonvolatile memory 310 may be, for example, a NAND flash memory, a vertical NAND flash memory (VNAND), a NOR flash memory, a resistive random access memory (RRAM), a phase change memory (PRAM), a magneto-resistive random access memory (MRAM), a ferroelectric random access memory (FRAM), a spin transfer torque random access memory (STT-RAM), or the like.

Furthermore, the nonvolatile memory 310 may have, for example, a three-dimensional array structure. In some embodiments of the inventive concept, a three dimensional (3D) memory array is provided. The 3D memory array is monolithically formed in one or more physical levels of arrays of memory cells having, for example, an active area disposed above a silicon substrate and circuitry associated with the operation of those memory cells. The associated circuitry may be above or within the substrate. That is, the circuit associated with the operation of the memory cells may be located in a substrate or on a substrate. The term "monolithic" means that layers of each level of the array are directly deposited on the layers of each underlying level of the array.

In some embodiments of the inventive concept, the 3D memory array includes, for example, vertical NAND strings that are vertically oriented, such that at least one of the memory cells is located over another memory cell. The at least one memory cell may include, for example, a charge trap layer. Each vertical NAND string may include at least one select transistor located over the memory cells. The at least one selection transistor may have the same structure as the memory cells, and be monolithically formed together with the memory cells.

The 3D memory array is formed of a plurality of levels and has word lines and/or bit lines shared among levels. The following patent documents, which are hereby incorporated by reference, describe suitable configurations for 3D memory arrays, in which the 3D memory array is configured as a plurality of levels, with word lines and/or bit lines shared between levels: U.S. Pat. No. 7,679,133; U.S. Pat. No. 8,553,466; U.S. Pat. No. 8,654,587; U.S. Pat. No. 8,559,235; and U.S. Patent Publication Number 2011/0233648. The nonvolatile memory 310 according to some embodiments of the inventive concepts may be applicable to a charge trap flash (CTF) in which an insulating layer is used as a charge storage layer, as well as a flash memory device in which a conductive floating gate is used as a charge storage layer.

The at least one cache DRAM 330 may perform a cache function of the at least one nonvolatile memory 310. The at least one cache DRAM 330 may store a tag corresponding to cache data or generate a match signal indicating a cache hit or a cache miss through tag comparison.

The computing system 10 according to some embodiments of the inventive concept may use the nonvolatile memory module 300 having the cache DRAM 330 as a working memory, which may reduce costs and provide higher capacity and performance than conventional computing systems.

Figure 2:
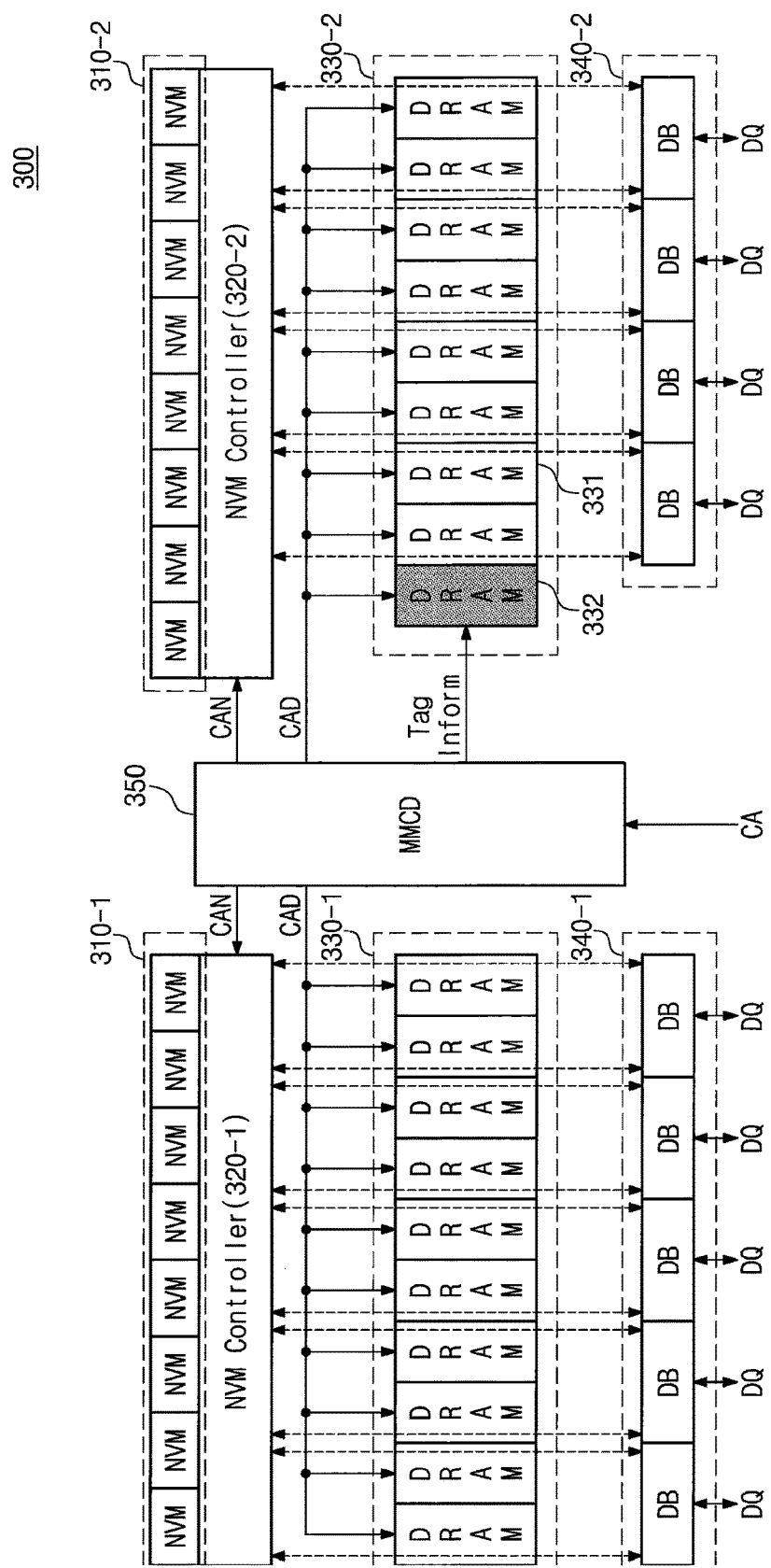
FIG. 2 is a block diagram illustrating a nonvolatile memory module according to some embodiments of the inventive concept.

FIG. 2 is a block diagram illustrating the nonvolatile memory module 300 of FIG. 1 according to some embodiments of the inventive concepts. Referring to FIG. 2, the nonvolatile memory module 300 may include nonvolatile memories (NVMs) 310-1 and 310-2, nonvolatile memory controllers 320-1 and 320-2, DRAMs 330-1 and 330-2, data buffers (DBs) 340-1 and 340-2, and a memory module control device (MMCD) 350. In the nonvolatile memory module 300 illustrated in FIG. 2, the first and second nonvolatile memories 310-1 and 310-2, the first and second nonvolatile memory controllers 320-1 and 320-2, the first and second DRAMs 330-1 and 330-2, and the first and second data buffers 340-1 and 340-2 may be respectively arranged, for example, at left and right sides with respect to the memory module control device MMCD 350; however, embodiments of the inventive concepts are not limited thereto. The first and second nonvolatile memories 310-1 and 310-2 may each include a plurality of nonvolatile memories (NVM). The first and second DRAMs 330-1 and 330-2 may each include a plurality of DRAMs. The first and second data buffers 340-1 and 340-2 may each include a plurality of data buffers. The first and second nonvolatile memory controllers 320-1 and 320-2 may be between the first and second nonvolatile memories 310-1 and 310-2 and the first and second DRAMs 330-1 and 330-2, respectively. The first and second DRAMs 330-1 and 330-2 may be between the first and second nonvolatile memory controllers 320-1 and 320-2 and the first and second data buffers 340-1 and 340-2, respectively.

The nonvolatile memory controllers 320-1 and 320-2 may control operations of the nonvolatile memories 310-1 and 310-2 based on a first command/address CAN, or a nonvolatile memory command/address. The first command/address CAN may be output from the memory module control device 350 to the first and second nonvolatile memory controllers 320-1 and 320-2. The number of the nonvolatile memories 310-1 and 310-2 illustrated in the nonvolatile memory module 300 of FIG. 2 is not limited thereto.

The DRAMs 330-1 and 330-2 may perform an input/output operation, for example, a write/read operation, based on a second command/address CAD, or a DRAM command/address. The second command/address CAD may be output from the memory module control device 350 to the first and second DRAMs 330-1 and 330-2. Each of the DRAMs 330-1 and 330-2 may include a dual port DRAM. For example, each of the DRAMs 330-1 and 330-2 may include first input/output ports and second input/output ports. The first input/output ports of the first and second DRAMs 330-1 and 330-2 may be connected to a data path between a DRAM 330-1/330-2 and the nonvolatile memory controller 320-1/320-2 corresponding thereto, and the second input/output ports of the first and second DRAMs 330-1 and 330-2 may be connected to a data path between the DRAM 330-1/330-2 and data buffers 340-1/340-2 corresponding thereto. In some embodiments, the first input/output ports may output 4 bytes (or 32 bits), and the second input/output ports may output 4 bytes (or 32 bits). Output data of the first and second input/output ports of the DRAMs 330-1 and 330-2 are not limited to the embodiments of FIG. 2 of the inventive concept.

At least one DRAM 331 of the plurality of first DRAMs 330-1 and the plurality of second DRAMs 330-2 may store a tag corresponding to a cache line and compare stored tag information with input tag information. The remaining DRAMs may be implemented to store cache data corresponding to the tag. Hereinafter, a DRAM, which stores tags, may be referred to as a "tag DRAM", and each of the remaining DRAMs may be referred to as a "data DRAM". The at least one DRAM 331 may be a tag DRAM. DRAM 332 may be a data DRAM.

In some embodiments, the tag DRAM 331 may store a 4-byte tag. In some embodiments, the tag DRAM 331 may store tags in a 2-way, 1:8 direct mapping scheme. The tag may include location information about cache data stored in the data DRAMs and dirty/clear information indicating validity of cache data. In some embodiments, the tag may include an error correction value for error correction. Thus, the tag DRAM 331 may further include an error correction circuit for correcting an error. The memory module control device 350 may provide tag information to the DRAM 330-2.

The tag DRAM 331 may not be limited to the 2-way and 1:8 direct mapping scheme described herein. It should be understood that a way or mapping scheme of the tag DRAM 331 may be determined according to various combinations.

In some embodiments, the tag DRAM and the data DRAM may include the same elements. In some embodiments, the tag DRAM and the data DRAM may include different elements. The number of the first and second DRAMs 330-1 and 330-2 illustrated in the nonvolatile memory module 300 of FIG. 2 is not limited thereto.

The first and second data buffers (DBs) 340-1 and 340-2 may be, respectively, connected to the first and second DRAMs 330-1 and 330-2 and may be configured to send data DQ provided from the processor 100, as illustrated in FIG. 1, to the first and second DRAMs 330-1 and 330-2, respectively, and send data DQ from the first and second DRAMs 330-1 and 330-2, respectively, to processor 100.

In some embodiments, the first and second data buffers 340-1 and 340-2 may be suitable for the DDR interface specifications. For example, each of the first and second data buffers 340-1 and 340-2 may input and output eight data signals and two data strobe signals. Although not illustrated in FIG. 2, each of the first and second data buffers 340-1 and 340-2 may output data, which is provided from the processor 100, to a DRAM corresponding thereto in response to a buffer command. In some embodiments, each of the data buffers 340-1 and 340-2 may include a first-in first-out (FIFO) or a dual port static random access memory (SRAM).

The memory module control device 350 may control an overall operation of the nonvolatile memory module (NVDIMM) 300. The memory module control device 350 may control the first and second nonvolatile memory controllers 320-1 and 320-2, the first and second DRAMs 330-1 and 330-2, and the first and second data buffers 340-1 and 340-2, such that the nonvolatile memory module 300 is used as a working memory. The memory module control device 350 may receive a command/address CA from the processor 100, as seen in FIG. 1, to generate a first command/address CAN, that is, a nonvolatile memory command/address, or a second command/address CAD, that is, a DRAM command/address. The memory module control device 350 may generate and manage a tag corresponding to a cache line.

Figure 3:
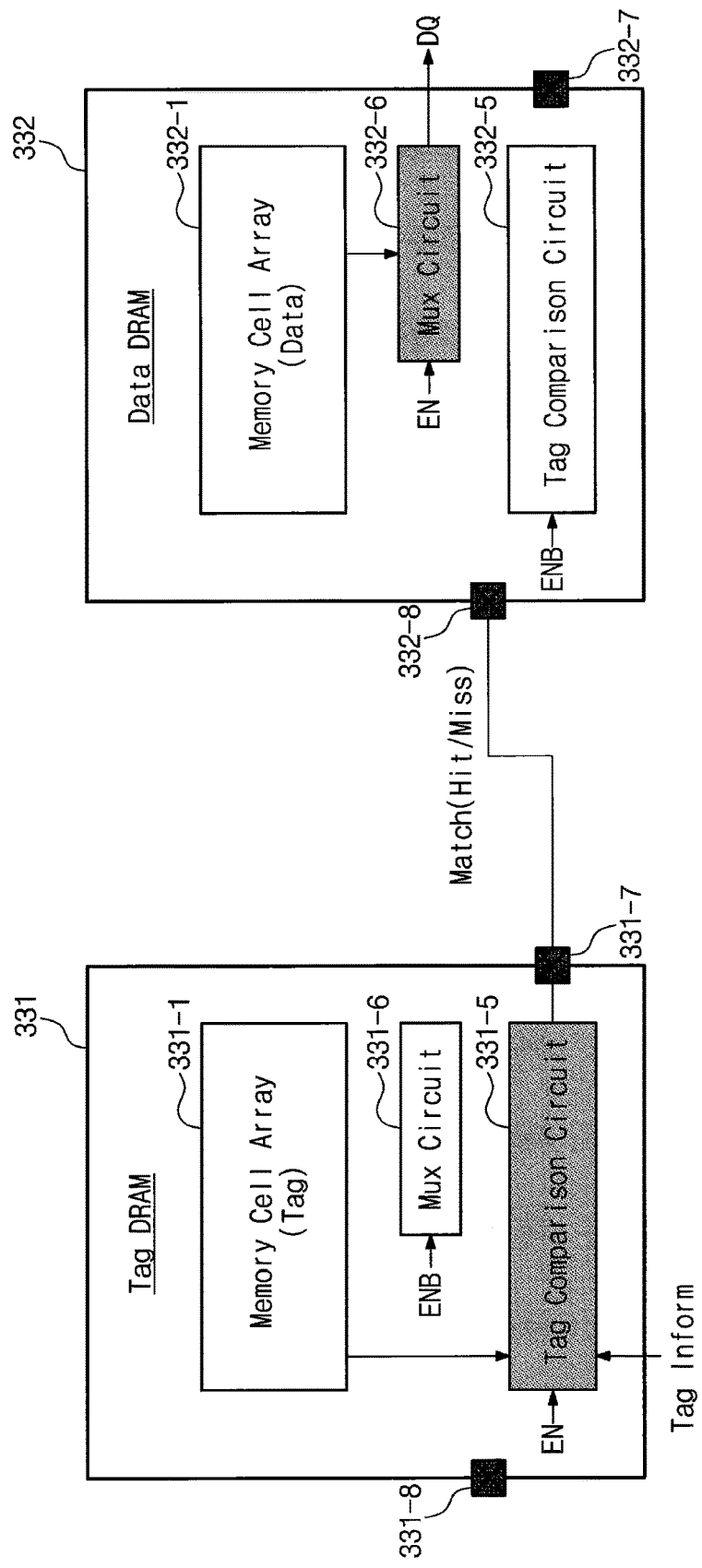
FIG. 3 is a block diagram illustrating a tag DRAM and a data DRAM, according to some embodiments of the inventive concept.

FIG. 3 is a block diagram for conceptually illustrating the tag DRAM 331 and the data DRAM 332 of FIG. 2. Referring to FIG. 3, the tag DRAM 331 and the data DRAM 332 may include the same elements, for example, memory cell arrays 331-1 and 332-1, tag comparison circuits 331-5 and 332-5, and multiplexers (Mux Circuit) 331-6 and 332-6. In some embodiments, each of the tag DRAM 331 and the data DRAM 332 may include a dual port DRAM. The dual port DRAM may include input/output ports respectively corresponding to different kinds of devices, for example, data buffer/nonvolatile memory controller. A data path of the dual port DRAM may be connected to a first external device, for example, a data buffer, or a second external device, for example, a nonvolatile memory controller, based on the selection of the multiplexer, that is, multiplexers 331-6 or 332-6.

The tag DRAM 331 may include the first memory cell array 331-1, the first tag comparison circuit 331-5, and the first multiplexer 331-6. The first memory cell array 331-1 may store a tag of a cache. In some embodiments, in a multi-way scheme, the first memory cell array 331-1 may store tags of a plurality of caches. The first memory cell array 331-1 may include a plurality of DRAM cells.

The first tag comparison circuit 331-5 may compare received tag information with a stored tag. The first tag comparison circuit 331-5 may receive the tag information from the memory module control device 350. In some embodiments, the first tag comparison circuit 331-5 may be activated according to a physical method, for example, fuse cutting or e-fuse, when the memory module 300 is manufactured. In some embodiments, the first tag comparison circuit 331-5 may be activated through a mode register set (MRS) setting. For convenience of description, FIG. 3 illustrates some embodiments in which the tag comparison circuit 331-5 is activated in response to an activation signal EN corresponding to the MRS setting.

In some embodiments, an output value, that is, a match signal Match, of the first tag comparison circuit 331-5 may be output to an external device through at least one pin 331-7.

The first multiplexer 331-6 may be deactivated according to the fuse cutting or the MRS setting. For example, the first multiplexer 331-6 may be deactivated when the first tag comparison circuit 331-5 is activated. For convenience of description, FIG. 3 illustrates some embodiments in which the multiplexer 331-6 is deactivated in response to a deactivation signal ENB corresponding to the MRS setting. In some embodiments, the tag DRAM 331 may include at least one pin 331-8 associated with an input of the multiplexer 331-6.

In some embodiments, the tag DRAM 331 may further include an error correction circuit for correcting an error of a tag.

The data DRAM 332 may include the second memory cell array 332-1, the second tag comparison circuit 332-5, and the second multiplexer 332-6. The second memory cell array 332-1 may store cache data corresponding to a tag. In some embodiments, in a multi-way scheme, the second memory cell array 332-1 may store cache data corresponding to a plurality of caches.

The second tag comparison circuit 332-5 may be deactivated according to the fuse cutting or the MRS setting. For example, the second tag comparison circuit 332-5 may be deactivated when the second multiplexer 332-6 is activated. For convenience of description, FIG. 3 illustrates some embodiments in which the second tag comparison circuit 332-5 is deactivated in response to the deactivation signal ENB corresponding to the MRS setting. In some embodiments, the data DRAM 332 may include at least one pin 332-7 associated with an output of the second tag comparison circuit 332-5.

The second multiplexer 332-6 may be activated according to the fuse cutting or the MRS setting. For convenience of description, FIG. 3 illustrates some embodiments in which the second multiplexer 332-6 is activated in response to the activation signal EN corresponding to the MRS setting.

In some embodiments, the second multiplexer 332-6 may receive a tag comparison result value, that is, a match signal Match, through at least one pin 332-8 from the pin 331-7 of the tag DRAM 331. If the tag comparison result value Match indicates a cache hit, the second multiplexer 332-6 may output data DQ associated with a cache line to the processor 100, illustrated in FIG. 1. The cache data DQ provided to the processor 100 may include a value indicating that data is valid. If the tag comparison result value Match indicates a cache miss, the second multiplexer 332-6 may not output data associated with a cache operation to the processor 100. In some embodiments, the data DRAM 332 may perform a flush operation with respect to data of the cache line and may try to change the cache line. That is, the second multiplexer 332-6 may be implemented to select one of a corresponding data buffer DB 340-1/340-2 and a corresponding nonvolatile memory controller NVM controller 320-1/320-2 as a data path in response to the tag comparison result value Match.

The tag DRAM 331 and the data DRAM 332 according to some embodiments of the inventive concept may include the same elements, however, operations of the elements in the tag DRAM 331 may be complementary to those of the elements in the data DRAM 332.

In the embodiments of FIGS. 2 and 3 a tag is stored in one, for example, tag DRAM 331, of the first and second DRAMs 330-1 and 330-2. However, embodiments of the present inventive concept are not limited thereto. The nonvolatile memory module 300 according to some embodiments of the inventive concepts may include a tag array storing a tag in each DRAM.

Figure 4:
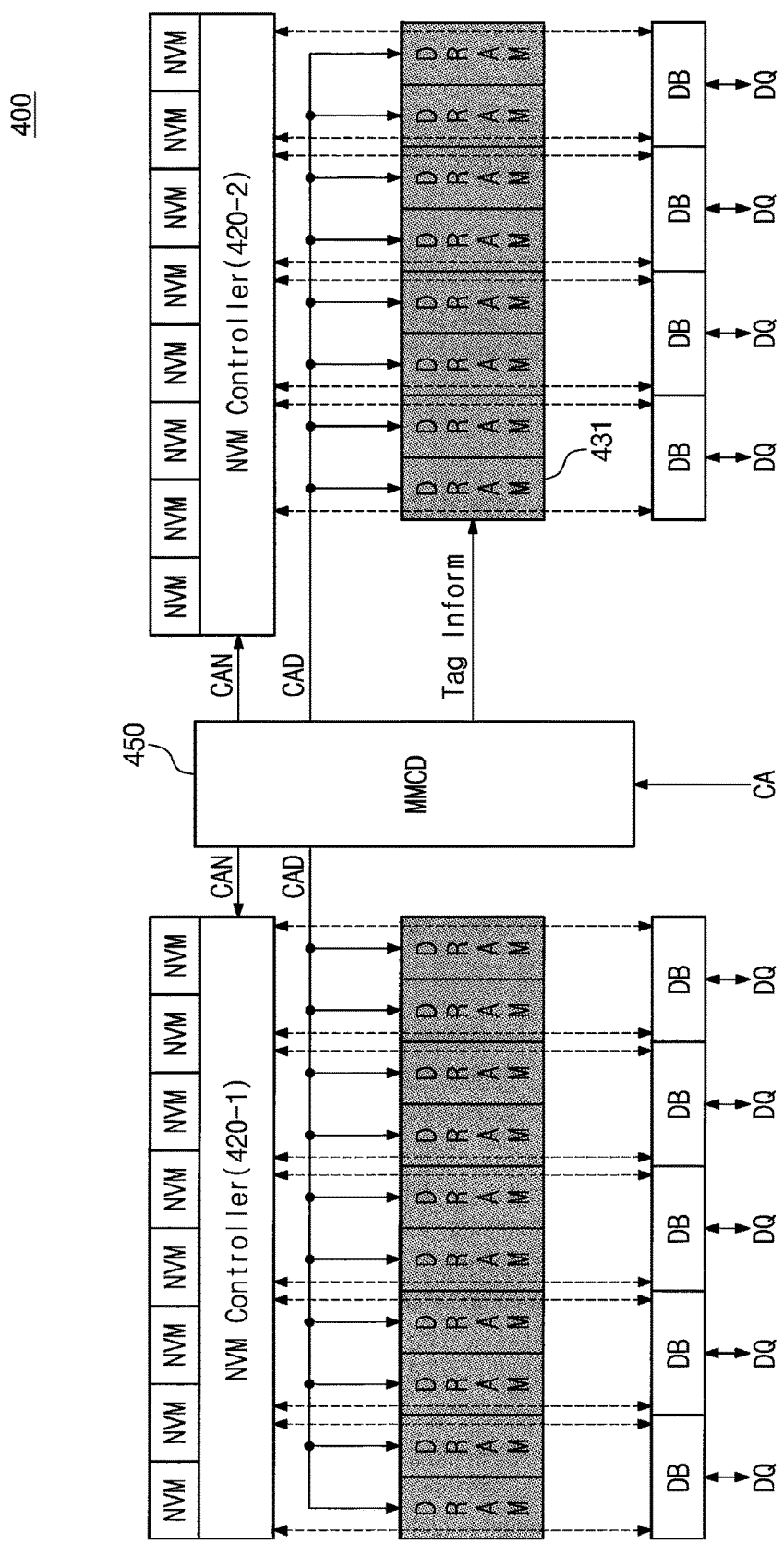
FIG. 4 is a diagram illustrating a nonvolatile memory module according to some embodiments of the inventive concept.

FIG. 4 is a block diagram illustrating a nonvolatile memory module 400 according to some embodiments of the inventive concept. Referring to FIG. 4, the nonvolatile memory module 400 may include a plurality of NVMs, first and second nonvolatile memory controllers 420-1 and 420-2, a plurality of DRAMs, and a plurality of data buffers DBs.

The nonvolatile memory module 400 may include the elements of nonvolatile memory module 300 of FIG. 1 except each of the DRAMs may include a tag array storing tags and a data array storing cache data corresponding to each tag. Each DRAM may perform tag comparison and may determine a data path for a data output of a cache line in response to a tag comparison result Match. The DRAMS include at least one DRAM 431.

Figure 5:
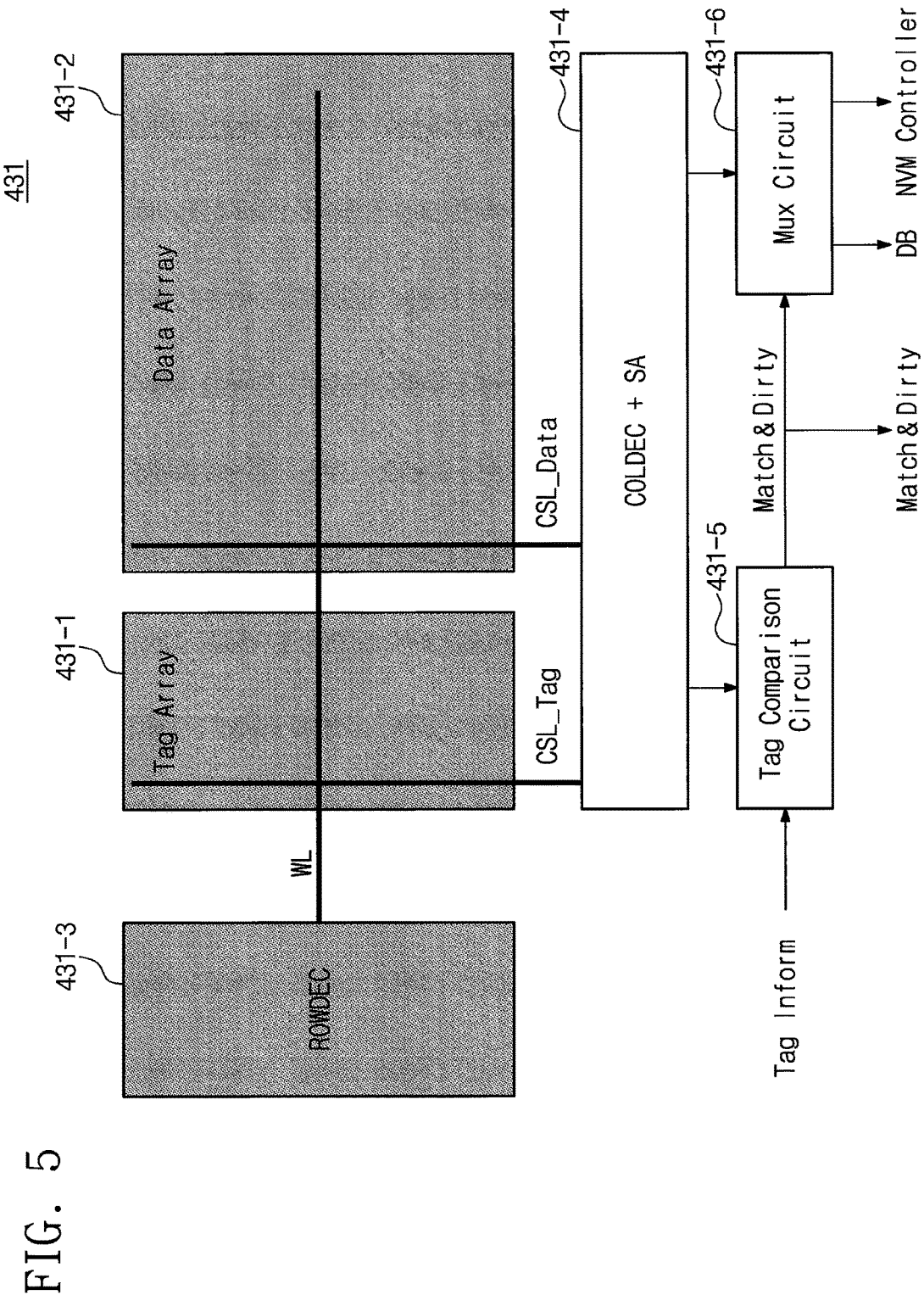
FIG. 5 is a block diagram illustrating one of the DRAMs illustrated in FIG. 4.

FIG. 5 is a block diagram illustrating one of the DRAMs 431 illustrated in FIG. 4. Referring to FIG. 5, the DRAM 431 may include a tag array 431-1, a data array 431-2, a row decoder (ROWDEC) 431-3, a column decoder and sense amplifier (COLDEC+SA) 431-4, a tag comparison circuit 431-5, and a multiplexer (Mux Circuit) 431-6.

The row decoder 431-3 may activate a word line WL in response to a row address. A plurality of DRAM cells may be connected to the word line WL. The DRAM cells connected to the word line WL may include first DRAM cells included in the tag array 431-1 and second DRAM cells included in the data array 431-2.

The column decoder and sense amplifier 431-4 may read DRAM cells corresponding to the word line WL and a column selection line or write data in DRAM cells. The column decoder and sense amplifier 431-4 may activate a first column selection line CSL_Tag corresponding to the tag array 431-1 and a second column selection line CSL_Data corresponding to the data array 431-2 in response to a column address. For example, the column decoder and sense amplifier 431-4 may activate the first column selection line CSL_Tag connected to the first DRAM cells of the tag array 431-1 and the second column selection line CSL_Data connected to the second DRAM cells of the data array 431-2 in response to the column address and may read a tag from the first DRAM cell of the tag array 431-1 or cache data corresponding to the tag from the second DRAM cells of the data array 431-2.

In some embodiments, the first column selection lines CSL_Tag and the second column selection line CSL_Data may be simultaneously activated in response to the column address. That is, the DRAM 431, according to some embodiments of the inventive concept, may activate two column selection lines CSL_Tag and CSL_Data in a bank.

The tag comparison circuit 431-5 may compare a tag stored in the tag array 431-1 with received tag information and output the comparison result Match & Dirty. A tag stored in the tag array 431-1 may include at least one bit indicating whether the data is dirty.

The multiplexer 431-6 may connect a data path to a data buffer DB, that is data buffer 340-1/340-2, or a nonvolatile memory (NVM) controller, that is, nonvolatile memory controller 320-1/320-2, in response to an output value of the tag comparison circuit 431-5.

Figure 6:
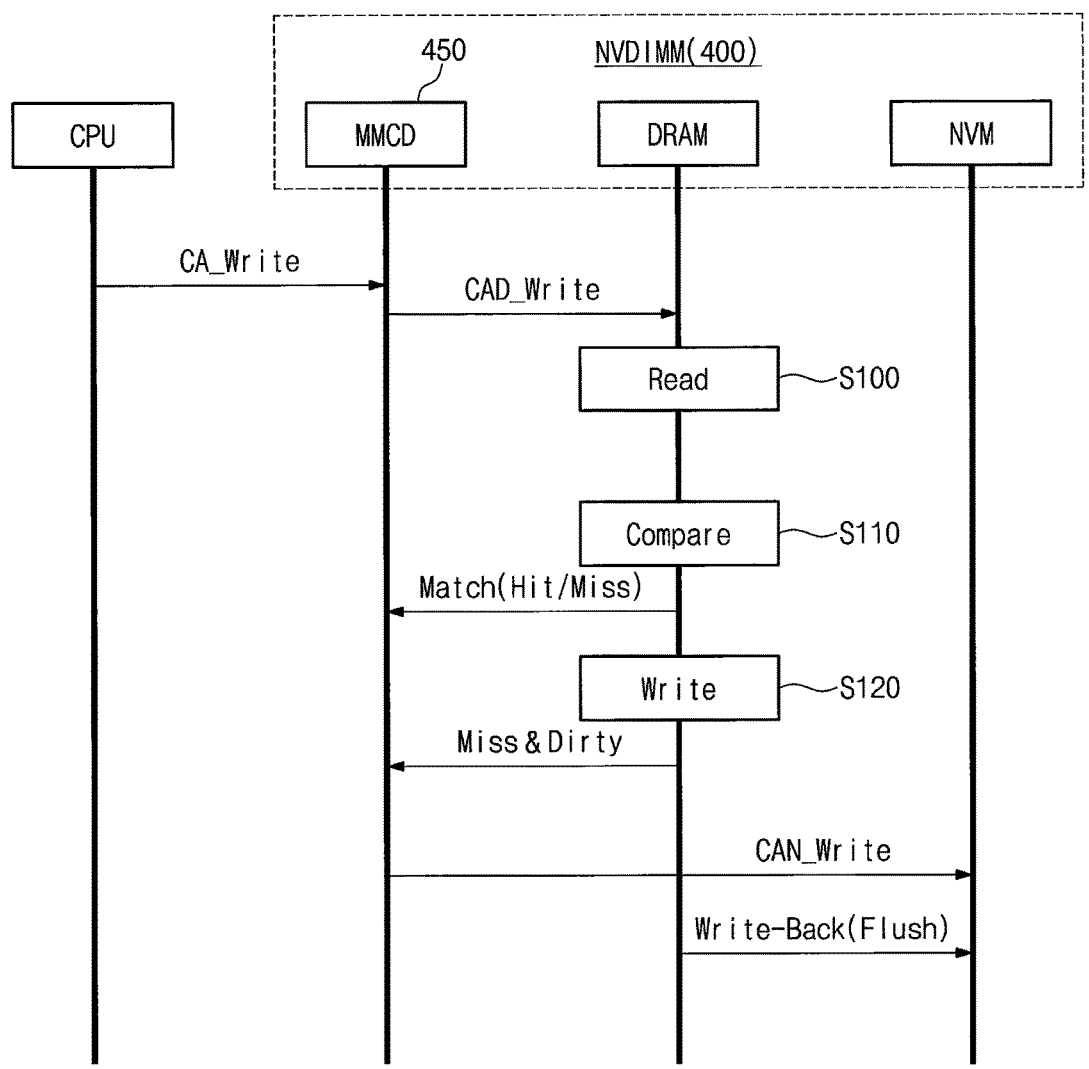
FIG. 6 is a diagram illustrating a write operation of a nonvolatile memory module illustrated in FIG. 4 according to some embodiments of the inventive concept.

FIG. 6 is a diagram illustrating a write operation of the nonvolatile memory module (NVDIMM) 400 illustrated in FIG. 4 according to some embodiments of the inventive concept. If a write request CA_Write is received by the memory module control device 450 from the processor (CPU) 100, the memory module control device MMCD 450 may generate a DRAM-dedicated write request CAD_Write, or a DRAM command/address, and may send it to a DRAM together with tag information. The DRAM may receive the tag information and the write request CAD_Write and may obtain a tag from an address corresponding to the write request CAD_Write. That is, the DRAM may read a tag from the address corresponding to the write request CAD_Write (S100). Afterwards, the DRAM may compare the read tag with the received tag information (S110) to output a tag comparison result value Match, which indicates a cache hit or a cache miss. If the tag comparison result value Match indicates a cache hit, there may be no need to perform a write request. If the tag comparison result value Match indicates a cache miss, data may be written at a cache line corresponding to an address of the write request (S120). Afterwards, a dirty value may be added to the tag of the cache line of the DRAM. The cache miss and dirty value Miss & Dirty of the DRAM may be output to the memory module control device MMCD 450. Afterwards, the memory module control device MMCD 450 may send the write request CAN_Write to the nonvolatile memory NVM so as to perform a flush operation, and data of a cache line stored in the DRAM may be written back (or flushed) Write-Back (Flush) to the nonvolatile memory NVM.

Figure 7:
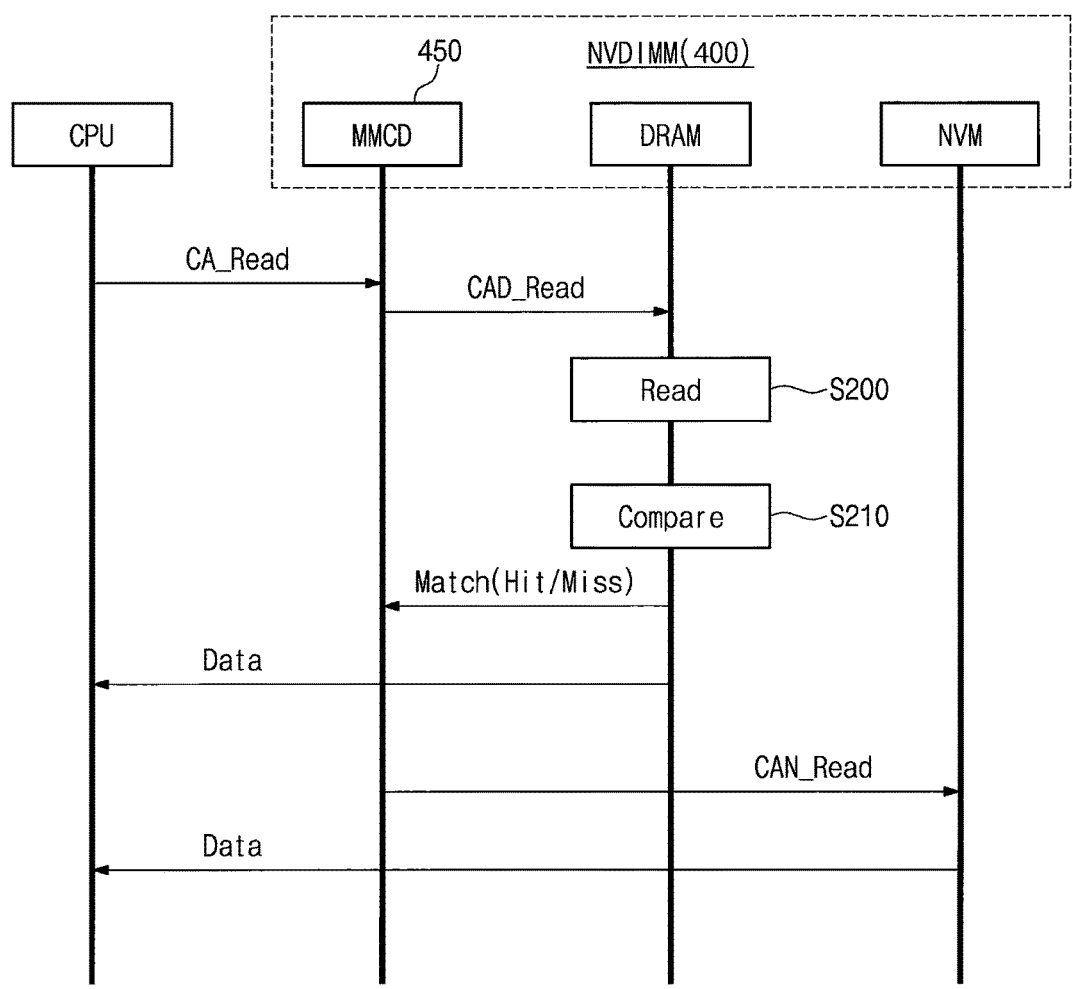
FIG. 7 is a diagram illustrating a read operation of a nonvolatile memory module of FIG. 4 according to some embodiments of the inventive concept.

FIG. 7 is a diagram illustrating a read operation of the nonvolatile memory module (NVDIMM) 400 of FIG. 4. If a read request CA_Read is received by the memory module control device MMCD 450 from the processor (CPU) 100, the memory module control device MMCD 450 may generate a DRAM-dedicated read request CAD_Read and may send it to a DRAM together with tag information. The DRAM may receive the tag information and the read request CAD_Read and may obtain a tag from an address corresponding to the read request CAD_Read. That is, the DRAM may read a tag from the address corresponding to the request CAN_Read (S200). Afterwards, the DRAM may compare the read tag with the received tag information (S210), to output a tag comparison result value Match which indicates a cache hit or a cache miss. If the tag comparison result value Match indicates a cache hit, data of a cache line of the DRAM may be output from the DRAM to the processor 100. If the tag comparison result value Match indicates a cache miss, the memory module control device MMCD 450 may generate a nonvolatile memory dedicated read request CAN_Read and may send the nonvolatile memory dedicated read request CAN_Read to the nonvolatile memory NVM. Afterwards, the nonvolatile memory NVM may read data corresponding to the read request CAN_Read and may transmit the read data to the processor 100 through the DRAM. Then, the data may be stored in a cache line of the DRAM.

The nonvolatile memory module 400 according to some embodiments of the inventive concepts may perform a multi way cache operation.

Figure 8:
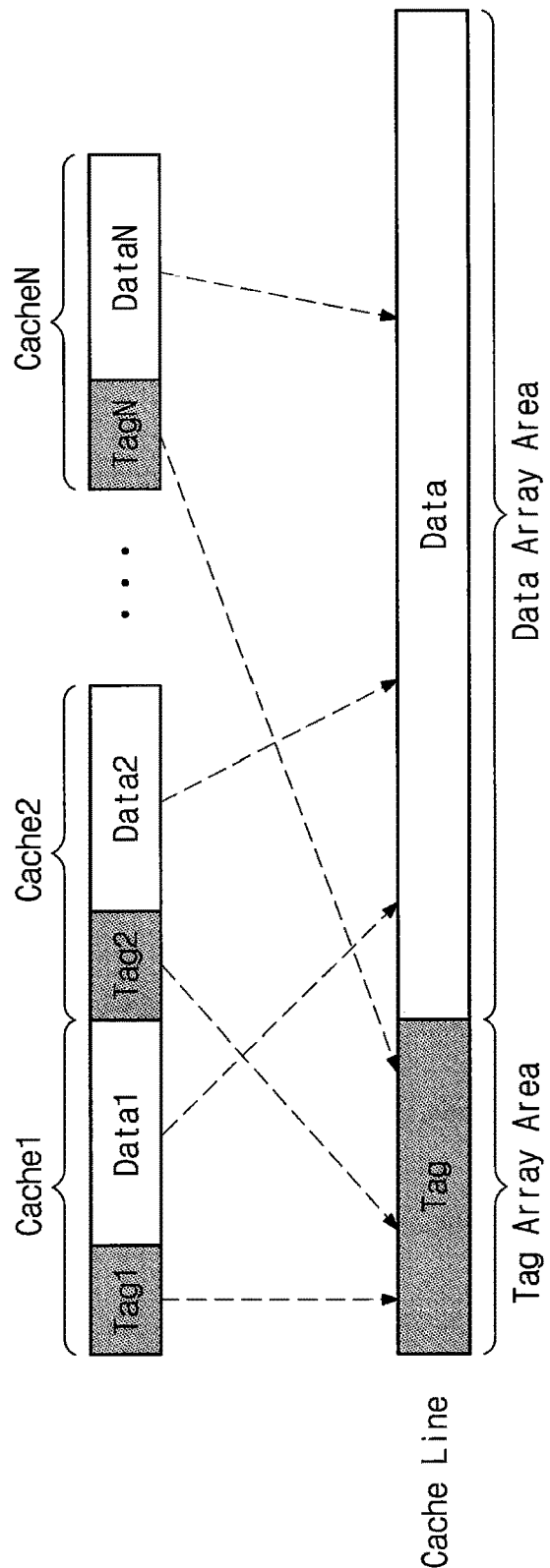
FIG. 8 is a diagram illustrating a configuration of a cache line supporting a multi way cache operation, according to some embodiments of the inventive concept.

FIG. 8 is a diagram illustrating a configuration of a cache line supporting a multi way cache operation, according to some embodiments of the inventive concept. Referring to FIG. 8, a cache line may be classified into a tag array area Tag, which stores tags Tag1 to TagN (N being an integer of 2 or more) respectively corresponding to a plurality of caches Cache1 to CacheN, and a data array area Data, which stores pieces of data Data1 to DataN respectively corresponding to the caches Cache1 to CacheN. Here, the tags may mean location information (or addresses) of the data Data1 to DataN, respectively.

The tag, according to some embodiments of the inventive concept, may correspond to the location information in a direct mapping method, a fully associative method, or a set associative method.

The cache, according to some embodiments of the inventive concept, may further include parity.

Figure 9A:
FIGS. 9A and 9B are diagrams illustrating a cache configuration having parity, according to some embodiments of the inventive concept.
Figure 9B:
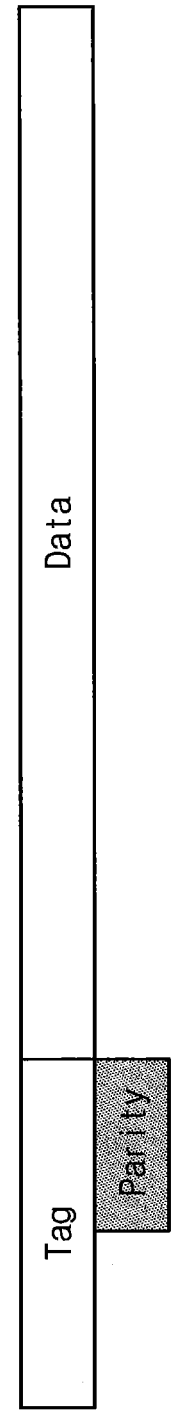

FIGS. 9A and 9B are diagrams illustrating a cache configuration having parity Parity, according to some embodiments of the inventive concept. Referring to FIG. 9A, the cache may be composed of a tag, cache data, and parity for error correction of the tag. Referring to FIG. 9B, the cache may be composed of a tag and cache data, and the tag may include parity.

Figure 10:
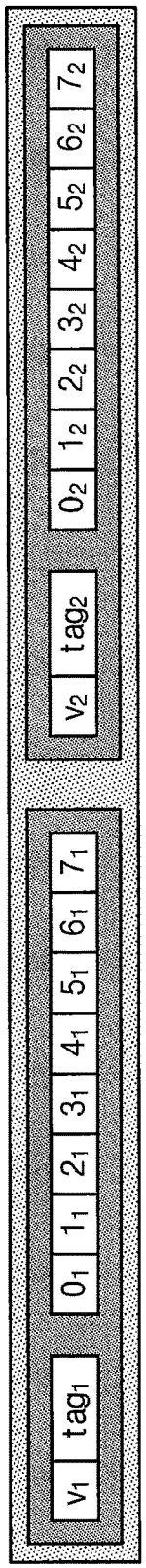
FIG. 10 is a diagram illustrating a method for outputting a cache based on a 2-way set associative method of a cache DRAM, according to some embodiments of the inventive concept.

FIG. 10 is a diagram illustrating a method of outputting a cache based on a 2-way set associative method of a cache DRAM, according to some embodiments of the inventive concept. Referring to FIG. 10, two sets of caches each composed of {Tag, Data} may be used for a 2-way set associative cache. For descriptive convenience, it is assumed that 8-bit data is output to a column selection line CSL, a tag has the size of 4 bits, and data has the size of 8 bits; however, the present inventive concepts are not limited thereto. As a tag column selection line CSL_Tag and a first column selection line CSL_1 are simultaneously activated, two sets of tags, for example, $tag_1$ and $tag_2$, may be output from a tag array area Tag, and a set of data $\{0_1, 1_1, 2_1, 3_1, 4_1, 5_1, 6_1, 7_1\}$ may be output from a data array area Data after a column to column delay time tCCD1. The output tags from the tag array Tag may include dirty/clear information $v_1$ and $v_2$, respectively, as well as tag information $tag_1$ and $tag_2$. When a second column selection line CSL_2 is activated after a delay time, for example, a column to column delay time tCCD2, the remaining set of data $\{0_2, 1_2, 2_2, 3_2, 4_2, 5_2, 6_2, 7_2\}$ may be output to a data array area. After a column to column delay time tCCD3 two sets of tags, for example $tag_3$ and $tag_4$, may be output from a tag array area Tag, and a set of data $\{0_3, 1_3, 2_3, 3_3, 4_3, 5_3, 6_3, 7_3\}$ may be output from a data array area Data after a column to column delay time tCCD3. The output tags from the tag array Tag may include dirty/clear information $v_3$ and $v_4$, respectively, as well as tag information $tag_3$ and $tag_4$. When a second column selection line CSL_2 is activated after a delay time, for example, a column to column delay time tCCD4, the remaining set of data $\{0_4, 1_4, 2_4, 3_4, 4_4, 5_4, 6_4, 7_4\}$ may be output to a data array area.

Meanwhile, it should be understood that a cache output method illustrated in FIG. 10 does not limit the embodiments of the inventive concepts. The N-way set associative cache may be output in various methods.

The nonvolatile memory module NVDIMM, according to some embodiments of the inventive concept, may be implemented with a solid state drive (SSD).

Figure 11:
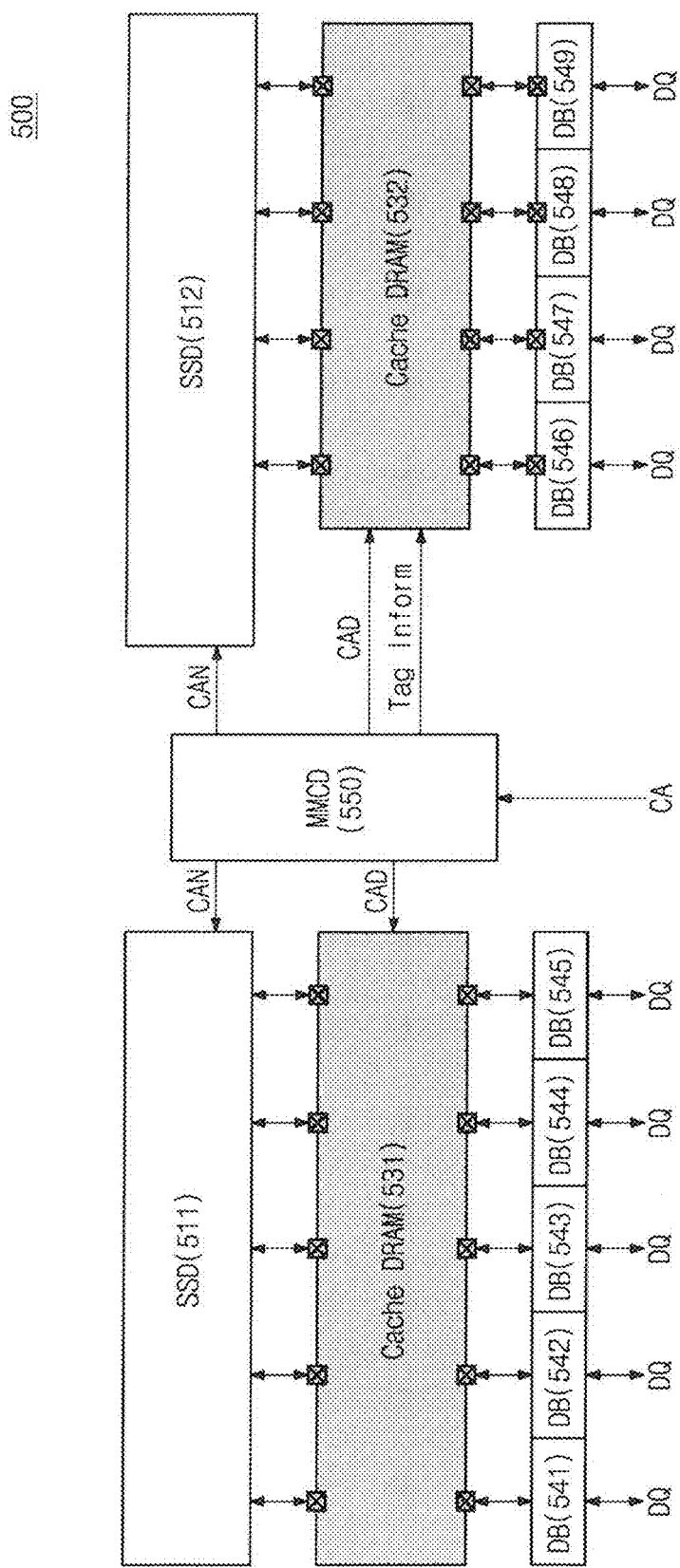
FIG. 11 is a block diagram illustrating a nonvolatile memory module according to some embodiments of the inventive concept.

FIG. 11 is a block diagram illustrating a nonvolatile memory module 500 according to some embodiments of the inventive concept. Referring to FIG. 11, the nonvolatile memory module 500 may include first and second solid state drives SSDs 511 and 512, first and second cache DRAMs 531 and 532, data buffers 541 to 549, and a memory module control device MMCD 550.

Each of the first and second solid state drives SSDs 511 and 512 may include nonvolatile memories to store massive data. Each of the first and second cache DRAMs 531 and 532 may be implemented to perform a cache function of each of the first and second solid state drives SSDs 511 and 512. Each of the first and second cache DRAMs 531 and 532 may be implemented with a dual port. Two cache DRAMs 531 and 532 are illustrated in FIG. 11; however, the embodiments of the present inventive concept are not limited thereto.

The solid state drives SSDs 511 and 512 may receive the first command/address CAN from the memory module control device 550. The cache DRAMs 531 and 532 may receive the second command/address CAD from the memory module control device 550. First input/output ports of cache DRAMs 531 and 532 may be connected to a data path between the cache DRAMs 531 and 532 and the solid state drives SSDs 511 and 512. The second input/output ports of cache DRAMs 531 and 532 may be connected to a data path between the cache DRAM 531 and 532 and the data buffers 541 to 549. The memory module control device 550 may provide tag information to the cache DRAM 532. The data buffers (DBs) 541 to 549 may be, respectively, connected to the cache DRAMs 531 and 532 and may be configured to send data DQ provided from the processor 100, as illustrated in FIG. 1, to the cache DRAMs 531 and 532, respectively, and send data DQ from the cache DRAMs 531 and 532, respectively, to processor 100. The memory module control device 550 may receive a command/address CA from the processor 100, as seen in FIG. 1.

The nonvolatile memory module NVDIMM, according to some embodiments of the inventive concept, may be implemented with a tiered memory to reduce routing.

Figure 12:
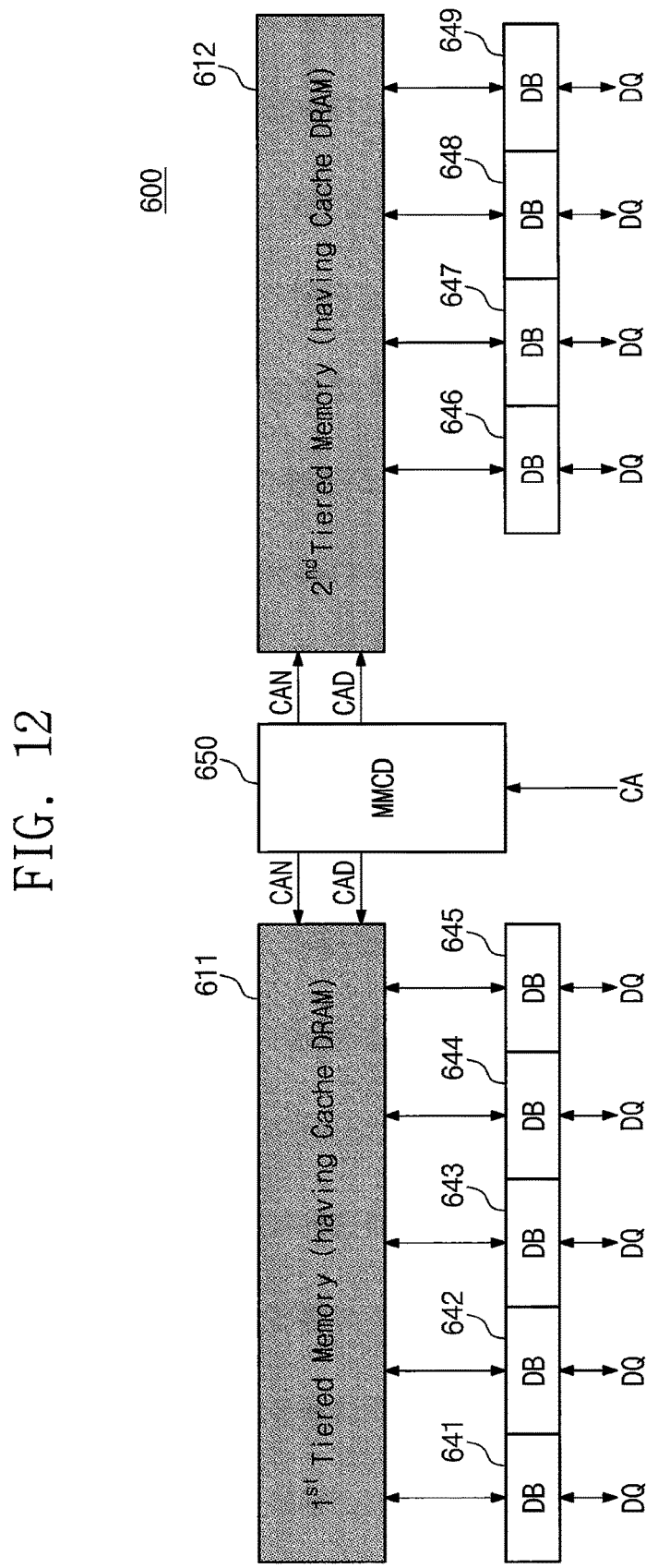
FIG. 12 is a block diagram illustrating a nonvolatile memory module according to some embodiments of the inventive concept.

FIG. 12 is a block diagram illustrating a nonvolatile memory module 600 according to some embodiments of the inventive concept. Referring to FIG. 12, the nonvolatile memory module 600 may include first and second tiered memories 611 and 612 having cache DRAM, data buffers 641 to 649, and a memory module control device 650.

Each of the first and second tiered memories 611 and 612 may include heterogeneous memories including at least one nonvolatile memory and at least one cache DRAM used as at least one cache.

The number of tiered memories 611 and 612 may be two, as illustrated in FIG. 12; however, the embodiments of the present inventive concept are not limited thereto.

The first and second tiered memories 611 and 612 may receive the first and second command/addresses CAN and CAD from the memory module control device 650. The first and second tiered memories 611 and 612 may be connected to the data buffers 641 to 649, respectively. The data buffers (DBs) 641 to 649 may be, respectively, connected to the first and second tiered memories 611 and 612 and may be configured to send data DQ provided from the processor 100, as illustrated in FIG. 1, to the first and second tiered memories 611 and 612, respectively, and send data DQ from the first and second tiered memories 611 and 612, respectively, to processor 100. The memory module control device 650 may receive a command/address CA from the processor 100, as shown in FIG. 1.

Figure 13:
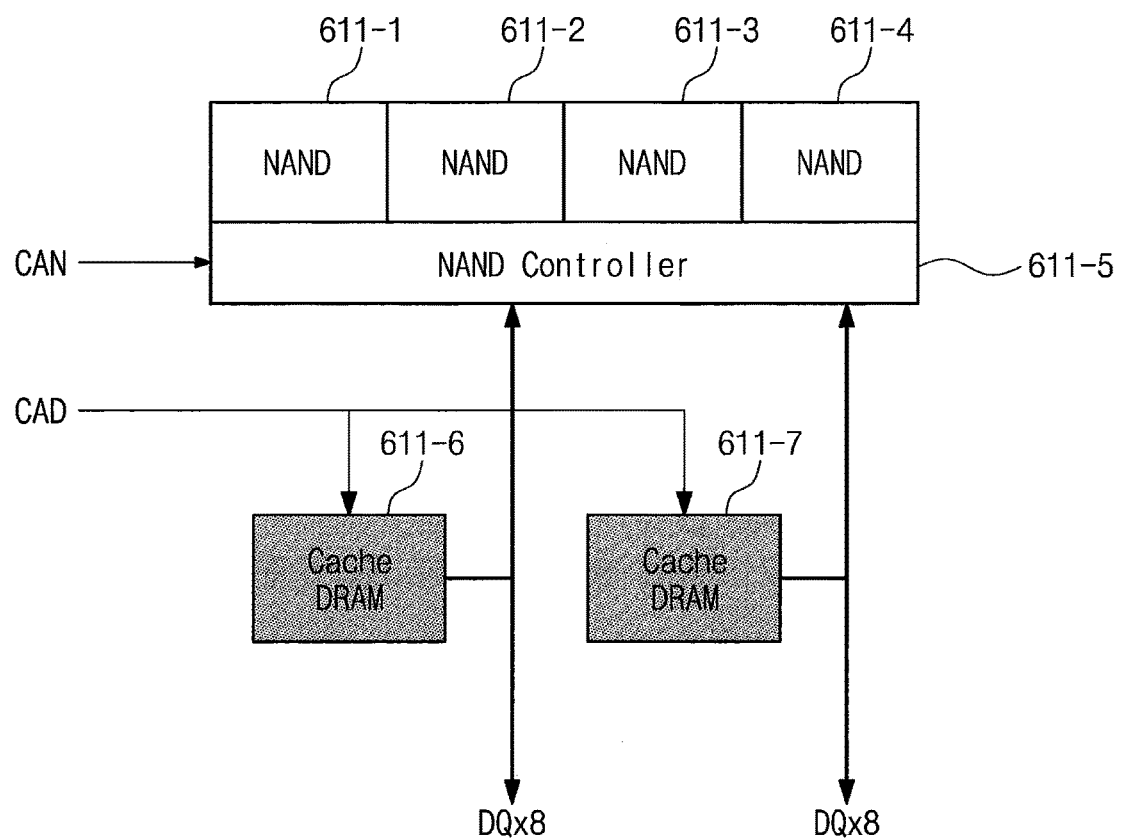
FIG. 13 is a block diagram illustrating a tiered memory according to some embodiments of the inventive concept.

FIG. 13 is a block diagram illustrating the tiered memory 611 according to some embodiments of the inventive concept. Referring to FIG. 13, the tiered memory 611 may include a plurality of NAND flash memories 611-1 to 611-4, a NAND flash memory controller 611-5, and cache DRAMs 611-6 and 611-7.

The NAND flash memory controller 611-5 and the cache DRAMs 611-6 and 611-7 may share input/output lines DQx8. Although not illustrated in FIG. 13, flush dedicated channels may be provided between the NAND flash memory controller 611-5 and the cache DRAMs 611-6 and 611-7. The NAND controller 611-5 receives the first command/address CAN from the memory module control device 650. The cache DRAMs 611-6 and 611-7 receive the second command/address CAD from the memory module control device 650.

Figure 14:
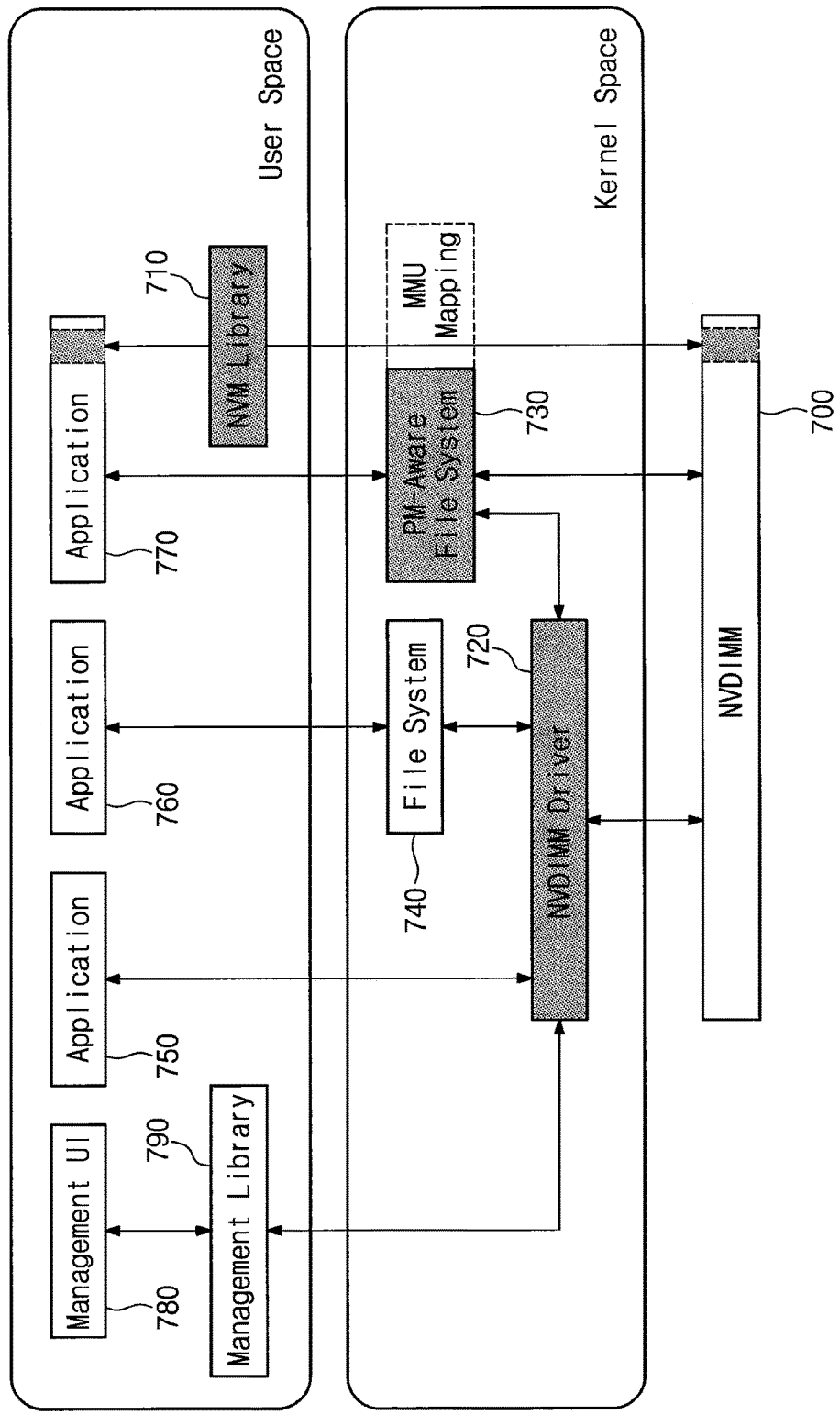
FIG. 14 is a block diagram illustrating a software architecture of a processor, according to some embodiments of the inventive concept.

FIG. 14 is a block diagram illustrating a software architecture of a processor, according to some embodiments of the inventive concept. Referring to FIG. 14, an application 770 may access a RAM of a nonvolatile memory module NVDIMM 700, for example, the nonvolatile memory modules NVDIMMs described herein, through a load/store interface which is accessible by using a nonvolatile memory library NVM Library 710. Furthermore, an application 770 and 760 through a nonvolatile memory module driver NVDIMM Driver 720 may access the nonvolatile memory module NVDIMM 700 by using a permanent memory (PM) aware file system PM-Aware File System 730 or a file system File System 740, respectively. Here, the nonvolatile memory module driver (NVDIMM driver) 720 may communicate with an application 750 through an application programming interface (API). Also, the application 750 may directly access the nonvolatile memory module by using a raw device access interface without passing through the file system. Here, the raw device may be an area that is not set by the file system.

Meanwhile, a management user interface (UI) 780 may control the nonvolatile memory module driver 720 by using a management library. The management library Management Library 790 may include instructions for managing memory allocation, cancellation, and the like on a main memory, or a system memory, of the memory module DIMM and/or the nonvolatile memory module NVDIMM 700. A kernel space includes the nonvolatile memory module driver 720, the file system 740 and the PM-Aware system 730. A user space includes applications 750, 760 and 770, nonvolatile memory library 710, management UI 780 and management library 790.

The computing system, according to some embodiments of the inventive concept, may further include a nonvolatile memory that is according to a DDR-T (transaction) interface.

Figure 15:
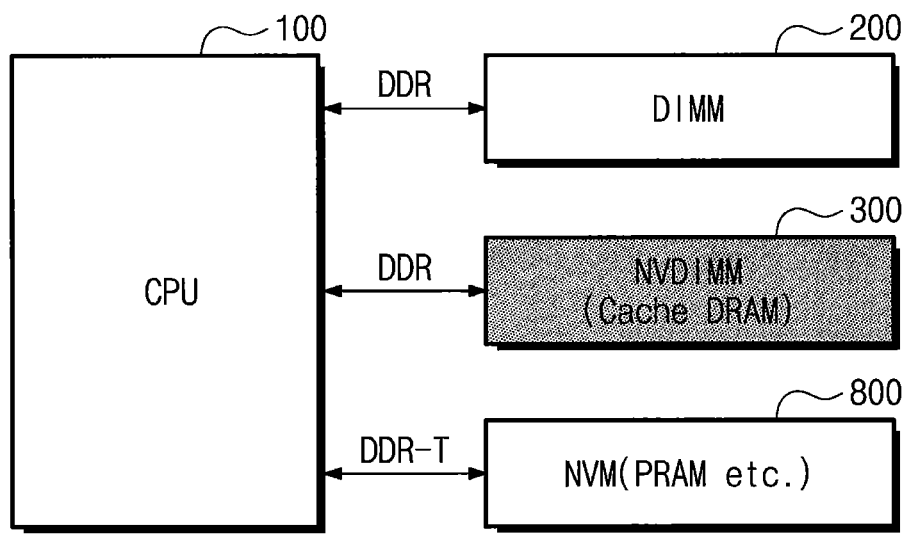
FIG. 15 is a diagram illustrating a computing system according to some embodiments of the inventive concept.

FIG. 15 is a diagram illustrating a computing system 20 according to some embodiments of the inventive concept. Referring to FIG. 15, the computing system 20 may include a processor 100, a memory module 200, a nonvolatile memory module NVDIMM 300 (cache DRAM), and a nonvolatile memory (NVM) 800, for example, a PRAM. Compared to the computing system 10 of FIG. 1, the computing system 20 may further include the nonvolatile memory 800 that inputs and outputs data according to the DDR-T interface. In such some embodiments, the memory module 200 may be implemented to perform a cache function of the nonvolatile memory 800. In some embodiments, the nonvolatile memory 800 may be a 3D-Xpoint memory.

The computing system 20 illustrated in FIG. 15 may use the memory module 200 as a cache of the nonvolatile memory 800; however, embodiments of the present inventive concept are not limited thereto.

A computing system according to some embodiments of the inventive concepts may use a DRAM included in a processor as a cache of the nonvolatile memory 800.

Figure 16:
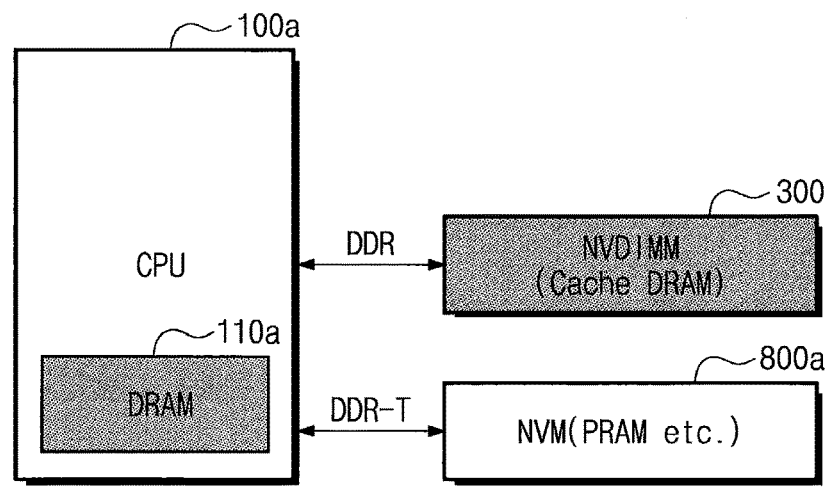
FIG. 16 is a diagram illustrating a computing system according to some embodiments of the inventive concept.

FIG. 16 is a diagram illustrating a computing system 30 according to some embodiments of the inventive concept. The computing system 30 includes a processor 100a, a nonvolatile memory module NVDIMM 300 (cache DRAM), and nonvolatile memory NVM 800a. A DRAM 110a is included in the processor 100a. Compared to the computing system 20 of FIG. 15, the computing system 30 of FIG. 16 may perform a cache function of a DIMM inside a DRAM 110a of a processor 100a.

A computing system according to some embodiments of the inventive concept may include a processor that includes a DRAM performing a cache function of a nonvolatile memory module NVDIMM.

Figure 17:
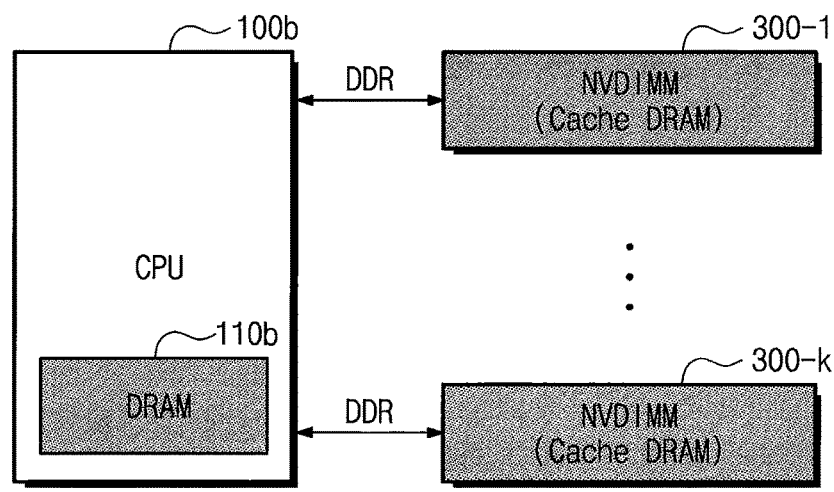
FIG. 17 is a diagram illustrating a computing system according to some embodiments of the inventive concept.

FIG. 17 is a diagram illustrating a computing system 40 according to some embodiments of the inventive concept. Referring to FIG. 17, the computing system 40 may include a host 100b including a DRAM 110b and nonvolatile memory modules NVDIMM (Cache DRAM) 300-1 to 300-k (k being an integer). The DRAM 110b may perform a cache function of the nonvolatile memory modules 300-1 to 300-k. The host 100b may be connected to the nonvolatile memory modules 300-1 to 300K according to DDR interfaces.

A computing system according to some embodiments of the inventive concept may be connected to various kinds of storage devices.

Figure 18:
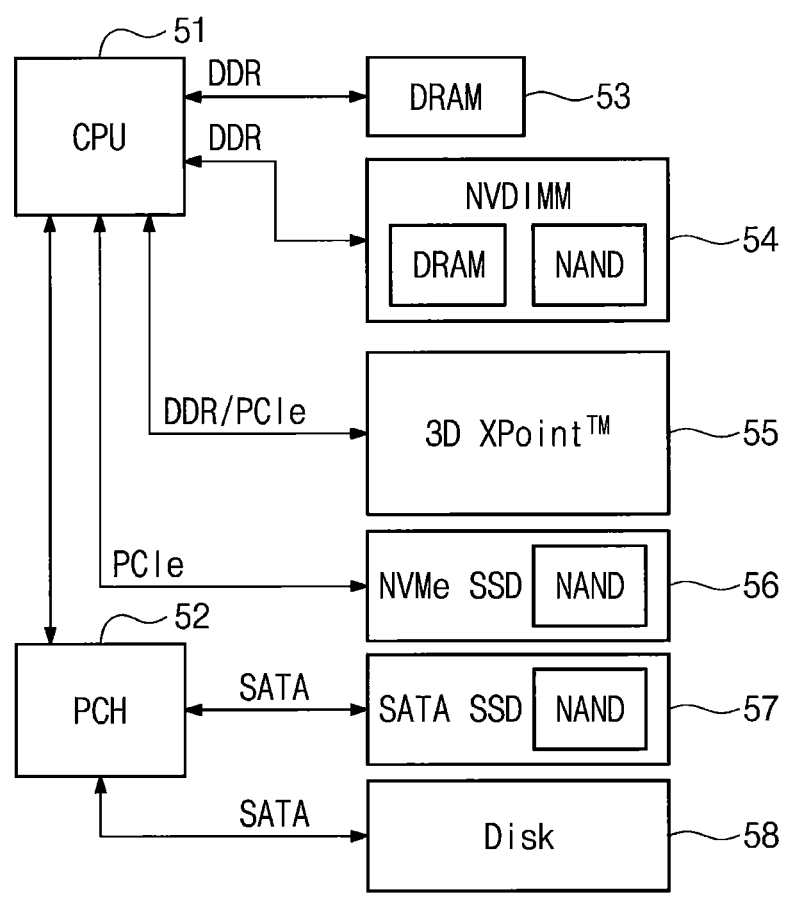
FIG. 18 is a diagram illustrating a computing system according to some embodiments of the inventive concept.

FIG. 18 is a block diagram illustrating a computing system 50 according to some embodiments of the inventive concept. Referring to FIG. 18, a computing system 50 may include a central processing unit (CPU) 51, a platform controller hub (PCH) 52, a DRAM 53, a nonvolatile memory module NVDIMM 54, a three-dimensional (3D) Xpoint™ memory 55, a NVM express (NVMe) solid state drive SSD 56, a Serial AT attachment (SATA) solid state drive SSD 57, and a disk 58.

The DRAM 53 and the NVDIMM 54 may communicate with the CPU 51 according to the DDR protocol. The 3D Xpoint memory 55 may communicate with the CPU 51 according to the DDR-T/PCIe protocol. The NVMe SSD 56 may communicate with the CPU 51 according to the PCIe protocol. The platform controller hub 52 may be connected with storage devices according to various interfaces. For example, the SATA SSD 57 may be connected to the platform controller hub 52 by using the SATA interface. The disk 58 may be connected to the platform controller hub 52 by using the SATA interface.

Figure 19:
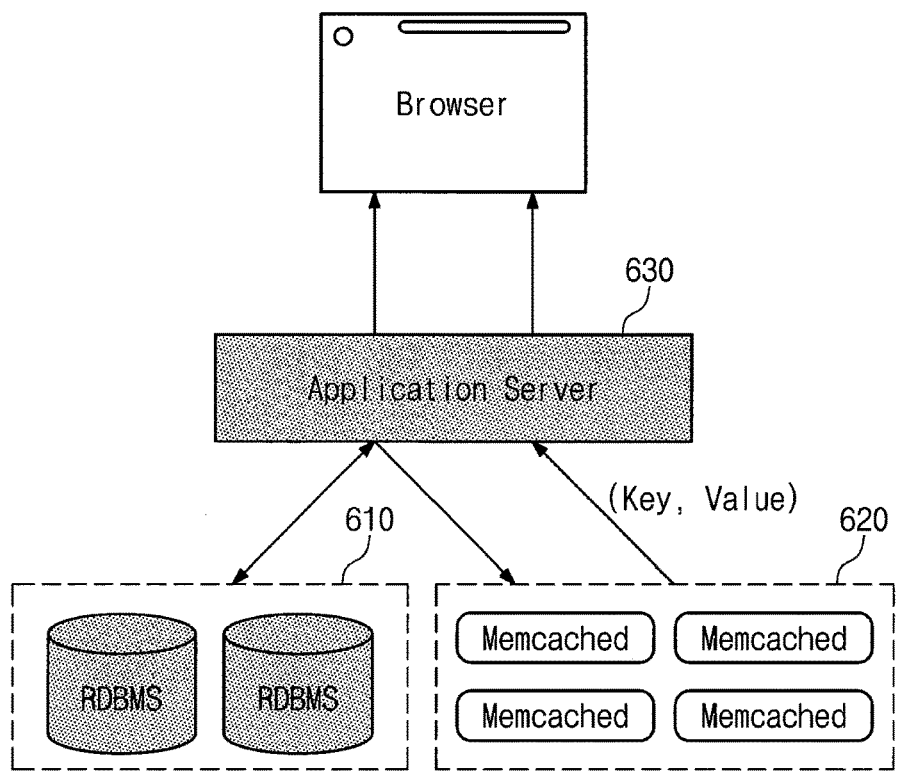
FIG. 19 is a block diagram illustrating a data server system according to some embodiments of the inventive concept.

FIG. 19 is a block diagram illustrating a data server system 60 according to some embodiments of the inventive concept. Referring to FIG. 19, the data server system 60 may include a related database management system (RDBMS) 610, a cache server 620, and an application server 630 and a browser.

The cache server 620 may maintain and delete a key, value pair that are different from each other in compliance with a disable notification from the related database management system 610.

At least one of the RDBMS 610, the cache server 620, and the application server 630 may include at least one of the nonvolatile memory modules NVDIMM described with reference to FIGS. 1 to 18.

The nonvolatile memory module is described with reference to FIGS. 1 to 19; however, embodiments of the inventive concepts are not limited thereto. Some embodiments of the inventive concept may be applicable to any kind of computing system that uses a DRAM as a cache of a nonvolatile memory.

Figure 20:
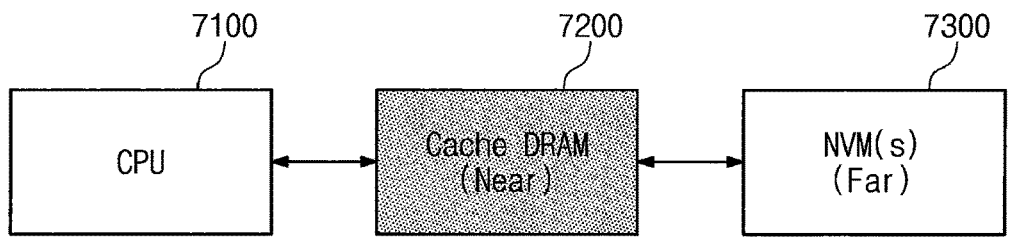
FIG. 20 is a diagram illustrating a computing system according to some embodiments of the inventive concept.

FIG. 20 is a block diagram illustrating a computing system 70 according to some embodiments of the inventive concepts. Referring to FIG. 20, the computing system 70 may include a CPU 7100, a cache DRAM 7200, and at least one nonvolatile memory 7300. The cache DRAM 7200 may perform a cache function of the nonvolatile memory 7300. The cache DRAM 7200 may be referred to as a "near memory" because it is relatively close to the CPU 7100, and the nonvolatile memory 7300 may be referred to as a "far memory" because it is relatively distant from the CPU 7100.

According to some embodiments of the inventive concept, a nonvolatile memory module and a computing system thereof may use a nonvolatile memory module having a cache DRAM as a working memory, which may reduce costs and improve capacity and performance.

Figure 21:
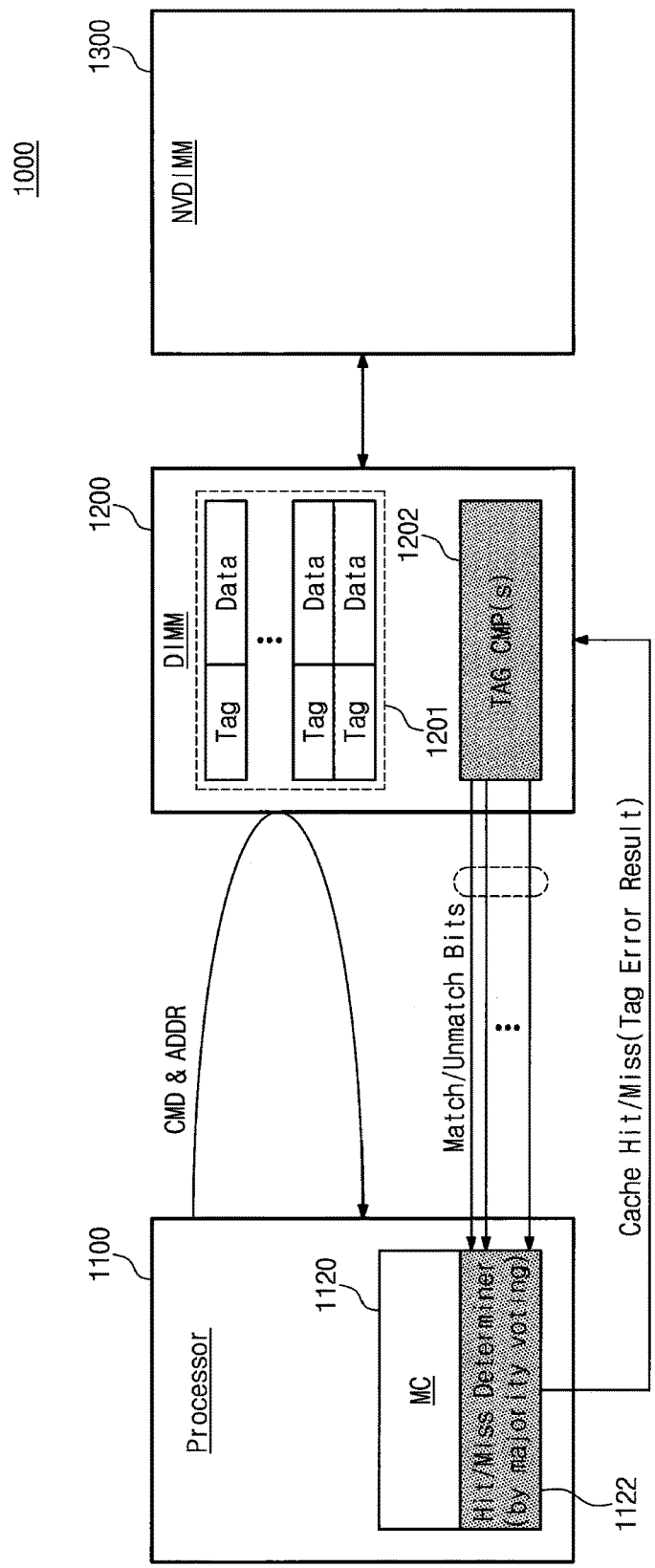
FIG. 21 is a block diagram illustrating a computing system according to some embodiments of the inventive concept.

FIG. 21 is a block diagram illustrating a computing system 1000, according to some embodiments of the inventive concept. Referring to FIG. 21, the computing system 1000 may include a processor (e.g., CPU) 1100, a memory module (DIMM) 1200, and a nonvolatile memory module (NVDIMM) 1300.

In some embodiments, the processor 1100 may include a memory controller 1120 for managing the memory module 1200 and the nonvolatile memory module 1300.

In some embodiments, the memory controller 1120 may include a hit/miss determiner 1122 that receives at least one match bit indicating a tag hit or at least one unmatch bit indicating a tag mismatch and determines a cache hit or a cache miss through majority voting. Here, the match/unmatch bits may be sent from the memory module 1200.

In some embodiments, when a match bit count corresponding to match/unmatch bits is greater than an unmatch bit count corresponding to unmatch bits, the hit/miss determiner 1122 may determine a cache hit. In contrast, when the match bit count is not greater than the unmatch bit count, the hit/miss determiner 1122 may determine a cache miss.

In another embodiment, in the case where the match bit count is not less than a specific value, the hit/miss determiner 1122 may determine that a cache hit occurs; in the case where the unmatch bit count is less than the specific value, the hit/miss determiner 1122 may determine that a cache miss occurs.

In some embodiments, the hit/miss determiner 1122 may determine whether a tag error is present, based on the match/unmatch bits. For example, when the match/unmatch bits are the same bit (e.g., "1" or "0"), it may be determined that a tag error is present.

In some embodiments, when a tag error is present, the hit/miss determiner 1122 may know information (e.g., a cache block ID) of a physical location of the memory module 1200 at which the tag error is generated and may include the information in a tag error result output to the memory module 1200.

The memory module 1200 may be connected to the processor 1100 through a DDR interface. In some embodiments, the memory module 1200 may include at least one DRAM. In some embodiments, the memory module 1200 may operate as a cache memory of the nonvolatile memory module 1300.

In some embodiments, the memory module 1200 may include a plurality of cache blocks 1201 that store data and tags corresponding to the data. In some embodiments, each of the cache blocks 1201 may be implemented with a DRAM.

In some embodiments, the memory module 1200 may include at least one tag comparator 1202 that determines whether a tag corresponding to an input address ADDR is present. For example, the tag comparator 1202 may compare tags output from the cache blocks 1201 with a value corresponding to the address ADDR and may output match/unmatch bits as the comparison results. In some embodiments, when an error is absent in a tag stored in each of the cache blocks 1201, tags output from the cache blocks 1201 may be the same each other. In contrast, when an error is present in a tag stored in each of the cache blocks 1201, tags output from the cache blocks 1201 may be different from each other.

In some embodiments, the memory module 1200 may determine whether to output data stored in a data buffer (not illustrated) to the processor 1100 based on cache hit/miss information from the processor 1100. For example, the memory module 1200 may output data stored in the data buffer when a cache hit occurs. In contrast, the memory module 1200 may not output data stored in the data buffer when a cache miss occurs.

In some embodiments, the memory module 1200 may correct a tag error of the corresponding cache block based on a tag error result sent together with the cache hit/miss information. Here, the tag error result may include information of a location of a cache block at which the tag error is generated.

In some embodiments, the memory module 1200 may send relevant information to the memory controller 1120 of the processor 1100 when the tag error is uncorrectable.

In some embodiments, the memory module 1200 may access a cache block in which a tag error is generated, based on location information of a normal cache block (a cache block in which a tag error is absent).

The nonvolatile memory module 1300 may be connected to the processor 1100 through the DDR interface. Although the nonvolatile memory module 1300 illustrated in FIG. 21 is connected to the processor 1100 based on the DDR interface, embodiments of the inventive concept may not be limited thereto. According to some embodiments of the inventive concept, the nonvolatile memory module 1300 may be connected to the processor 1100 through various kinds of communication interfaces in addition to the DDR interface.

The nonvolatile memory module 1300 may be used as a working memory of the processor 1100. The nonvolatile memory module 1300 may include at least one nonvolatile memory.

According to some embodiments of the inventive concept, the computing system 1000 may improve the performance of a cache operation of the memory module 1200 when a tag error is generated, by including the processor 1100 that performs tag comparison in the memory module 1200 and determining a cache hit/cache miss on match/unmatch bits obtained as the tag comparison result based on the majority voting.

Also, according to some embodiments of the inventive concept, the computing system 1000 may not propagate a tag error to the whole system by selecting an appropriate operation by using a tag error result when a tag error is generated. Accordingly, it may be possible to improve the performance of system.

Figure 22:
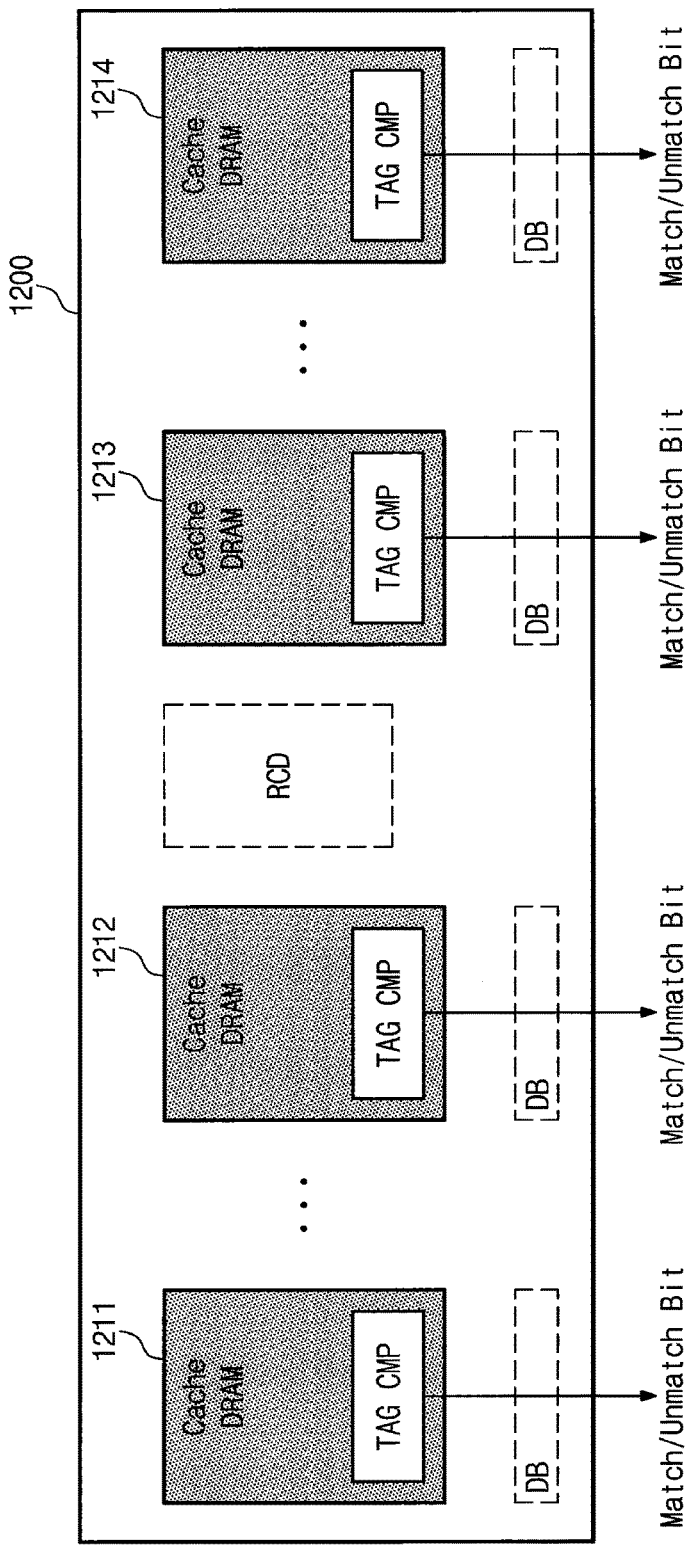
FIG. 22 is a block diagram illustrating a memory module according to some embodiments of the inventive concept.

FIG. 22 is a block diagram illustrating the memory module 1200, according to some embodiments of the inventive concept. Referring to FIG. 22, the memory module 1200 may include a plurality of cache DRAMs 1211, 1212, 1213, and 1214. The cache DRAMs 1211, 1212, 1213, and 1214 may operate as a cache of the nonvolatile memory module 1300 (refer to FIG. 21). Meanwhile, four cache DRAMs 1211, 1212, 1213, and 1214 are illustrated in FIG. 22. However, it should be understood that the number of cache DRAMs included in the memory module 1200 is not limited hereto.

In some embodiments, the cache DRAMs 1211, 1212, 1213, and 1214 may be implemented to perform an input/output operation (e.g., a write/read operation) based on a command CMD/address ADDR.

In some embodiments, each of the cache DRAMs 1211, 1212, 1213, and 1214 may be implemented with a dual port DRAM. For example, one port may be connected to a data path of the processor 1100, and the other port may be connected to a data path of the nonvolatile memory module 1300.

In some embodiments, each of the cache DRAMs 1211, 1212, 1213, and 1214 may be implemented to store data and a tag corresponding to the data. In some embodiments, the cache DRAMs 1211, 1212, 1213, and 1214 may store the same tag, and different data corresponding to a tag may be respectively stored in the cache DRAMs 1211, 1212, 1213, and 1214. That is, different data corresponding to the same tag may be respectively stored in the cache DRAMs 1211, 1212, 1213, and 1214.

In some embodiments, each of the cache DRAMs 1211, 1212, 1213, and 1214 may include a tag comparator TAG CMP. In some embodiments, in each of the cache DRAMs 1211, 1212, 1213, and 1214, the tag comparator TAG CMP may compare a tag stored in the corresponding cache DRAM and a tag corresponding to an address received from the processor 1100 and may output a match/unmatch bit as the comparison result.

In some embodiments, the memory module 1200 may further include data buffers DB or a registered connective device RCD. In some embodiments, the memory module 1200 may be implemented with a DDR series interface. For example, the memory module 1200 may be implemented to satisfy a DDR4E specification.

In some embodiments, the data buffers DB may be respectively connected to the cache DRAMs 1211, 1212, 1213, and 1214 and may be implemented to send data received from the processor 1100 to the cache DRAMs 1211, 1212, 1213, and 1214 or to send data output from the cache DRAMs 1211, 1212, 1213, and 1214 to the processor 1100.

In some embodiments, each of the data buffers DB may be implemented to be suitable for the DDR interface standard. For example, each of the data buffers DB may be implemented to input and output eight data signals and two data strobe signals. Although not illustrated in FIG. 22, each of the data buffers DB may output data input from the processor 1100 to the corresponding cache DRAM in response to a buffer command. In some embodiments, each of the data buffers DB may be implemented with a first-in first-out (FIFO) memory or dual-port SRAM.

In some embodiments, the registered connective device RCD may be implemented to control an input/output operation of the memory module 1200 in response to a command CMD and an address ADDR received from the processor 1100.

In some embodiments, the registered connective device RCD may receive a tag error result from the processor 1100 and may manage/control a cache DRAM, at which a tag error is generated, based on a specific policy. For example, the registered connective device RCD may receive the tag error result and may control the corresponding cache DRAM, at which a tag error is generated, such that the tag error is corrected.

In some embodiments, the registered connective device RCD may instruct a cache DRAM, at which a tag error is generated, to correct the tag error internally. To this end, the cache DRAM may include an error correction circuit therein. In another embodiment, the registered connective device RCD may update a tag value of a cache DRAM, at which a tag error is not generated, to a cache DRAM at which a tag error is generated.

Meanwhile, according to some embodiments of the inventive concept, the registered connective device RCD of the memory module 1200 may separately manage a cache DRAM based on a tag error result. However, embodiments of the inventive concept may not be limited thereto. According to some embodiments of the inventive concept, the memory module 1200 may be also implemented to directly receive a tag error result from each cache DRAM and to manage a cache DRAM based on a generated tag error.

Figure 23:
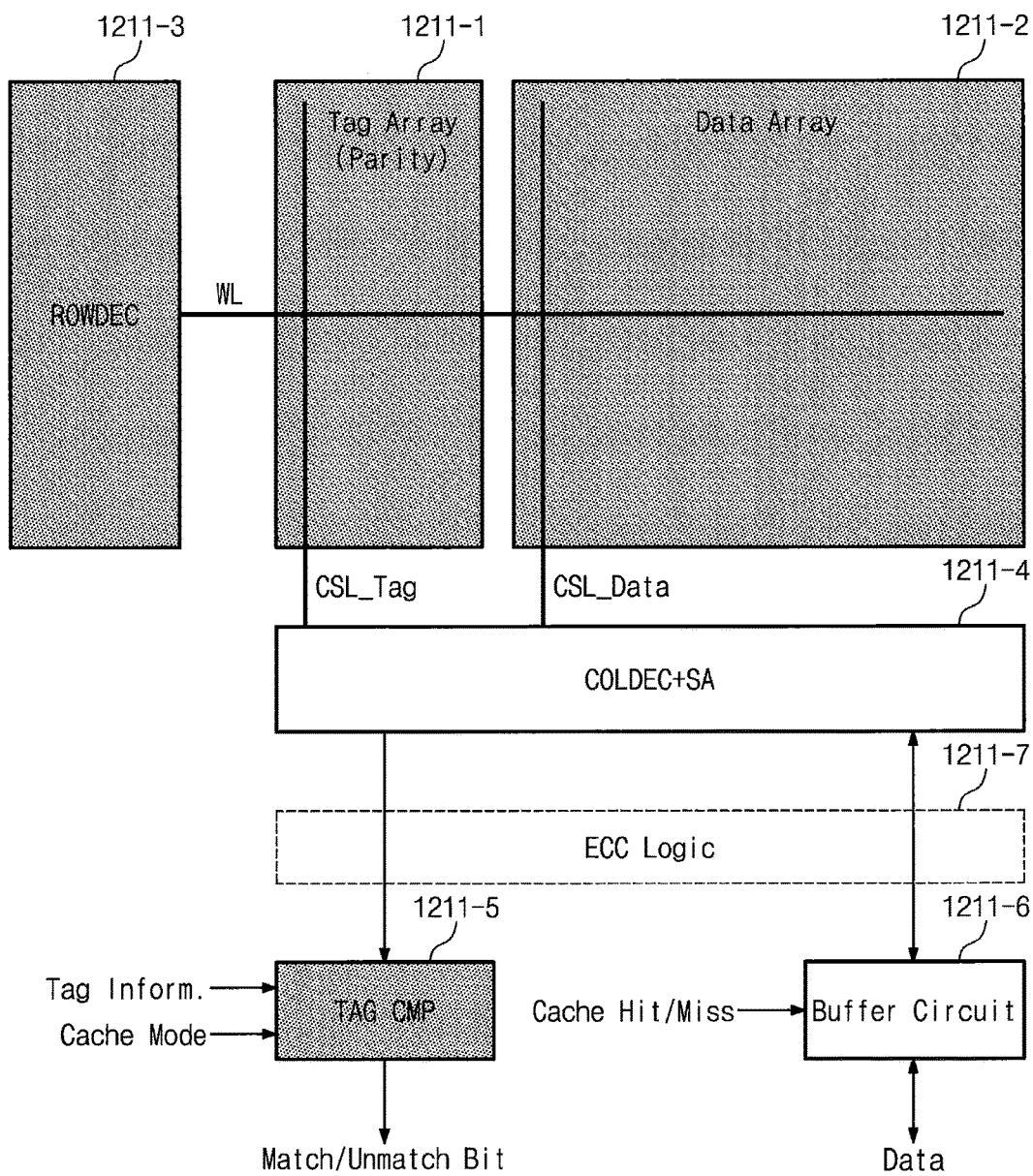
FIG. 23 is a block diagram illustrating a cache DRAM according to some embodiments of the inventive concept.

FIG. 23 is a block diagram illustrating a cache DRAM, according to some embodiments of the inventive concept. Referring to FIG. 23, the cache DRAM 1211 may include a first memory cell array 1211-1, a second memory cell array 1211-2, a row decoder 1211-3, a column decoder and sense amplifier 1211-4, a tag comparator 1211-5, and a buffer circuit 1211-6.

In some embodiments, the first memory cell array 1211-1 may include a plurality of first DRAM cells that store cache tags. Each of the first DRAM cells may correspond to any one word line WL and any one column selection line CSL_Tag. In some embodiments, in a multi-way scheme, the first memory cell array 1211-1 may store tags of a plurality of caches.

In some embodiments, the second memory cell array 1211-2 may include a plurality of second DRAM cells that store data corresponding to tags. Each of the second DRAM cells may correspond to any one word line WL and any one column selection line CSL_data.

Meanwhile, the first DRAM cells of the first memory cell array 1211-1 and the second DRAM cells of the second memory cell array 1211-2 are connected to any one word line WL. However, a configuration of the cache DRAM 1211 is not limited thereto. According to some embodiments of the inventive concept, the cache DRAM 1211 may include a first word line to which the first DRAM cells of the first memory cell array 1211-1 are connected and a second word line to which the second DRAM cells of the second memory cell array 1211-2 are connected. Here, the second word line may be different from the first word line.

The row decoder 1211-3 may select (activate) any one of a plurality of word lines in response to an input address.

The column decoder and sense amplifier 1211-4 may be implemented to read data from DRAM cells corresponding to a word line WL and a column selection line or write data in the DRAM cells. The column decoder and sense amplifier 1211-4 may be implemented to activate a first column selection line CSL_Tag corresponding to the first memory cell array 1211-1 and a second column selection line CSL_Data corresponding to the second memory cell array 1211-2 in response to a column address. For example, the column decoder and sense amplifier 1211-4 may activate the first column selection line CSL_Tag connected to the first DRAM cells and the second column selection line CSL_Data connected to the second DRAM cells in response to the column address and may read a tag from the first DRAM cells or cache data corresponding to the tag from the second DRAM cells.

The tag comparator 1211-5 may be implemented to compare received tag information (information associated with an input address, for example, an index and an offset) with a stored tag. In some embodiments, the tag comparator 1211-5 may be activated according to a setting of a mode register set (MRS). For convenience of description, some embodiments are illustrated in FIG. 23 as the tag comparator 1211-5 is activated in response to cache mode information corresponding to the MRS setting. In another embodiment, the tag comparator 1211-5 may be activated according to a physical manner (e.g., fuse cutting or e-fuse selection) upon manufacturing the memory module 1200.

In some embodiments, an output value, i.e., the match/unmatch bit of the tag comparator 1211-5 may be output to the outside through at least one pin.

In some embodiments, the buffer circuit 1211-6 may buffer data in an input/output operation. For example, the buffer circuit 1211-6 may buffer data until detecting of a tag error is completed in a write operation. In some embodiments, the buffer circuit 1211-6 may commit a write operation on buffered data after recovering a tag error. In this case, a tag error may not propagate to the memory module 1200 or the nonvolatile memory module 1300 (refer to FIG. 21).

In some embodiments, the buffer circuit 1211-6 may be implemented to output data based on cache hit/miss information sent from the processor 1100 in the read operation.

Meanwhile, according to some embodiments of the inventive concept, the cache DRAM 1211 may further include error correction (ECC) logic 1211-7. In some embodiments, the error correction logic 1211-7 may internally detect and correct an error of a tag or data. In some embodiments, for the error correction operation, the first memory cell array 1211-1 may store a parity corresponding to a tag and/or data.

Figure 24:
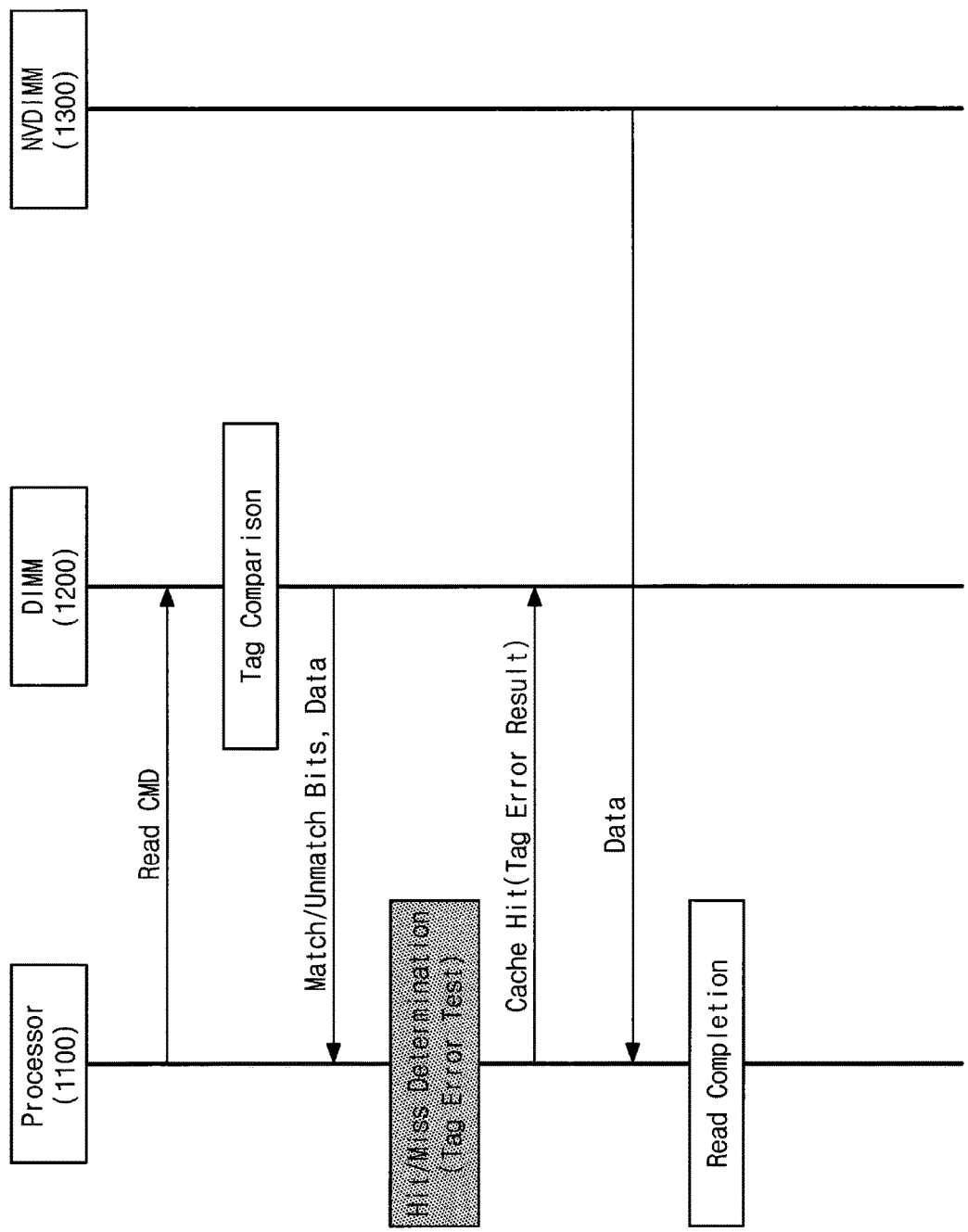
FIG. 24 is a ladder diagram illustrating an example of a read operation of the computing system when a cache hit occurs, according to some embodiments of the inventive concept.

FIG. 24 is a ladder diagram illustrating an example of a read operation of the computing system 1000 when a cache hit occurs, according to some embodiments of the inventive concept. Below, a read operation will be described with reference to FIG. 24. The processor 1100 may send a read command Read CMD and an address to the memory module (DIMM) 1200. The tag comparators TAG CMP of the cache DRAMs 1211, 1212, 1213, and 1214 (refer to FIG. 22) of the memory module 1200 may output match/unmatch bits by comparing tag information corresponding to the address with tags stored therein, and the match/unmatch bits may be sent to the processor 1100.

The hit/miss determiner 1120 (refer to FIG. 21) of the processor 1100 may determine whether a cache hit/miss occurs, based on the match/unmatch bits. At the same time, a tag error test operation for determining whether an error is present in a tag may be performed. Information about a cache DRAM in which an error is present may be generated as the tag error test result. If a cache hit occurs and a tag error is absent as determined based on the match/unmatch bits, a read operation on received data may be completed. In contrast, if it is determined that a cache hit occurs and a tag error is present, the processor 1100 may send information about the cache hit and the tag error result to the memory module 1200.

The memory module 1200 may receive the cache hit information and the tag error result and may output data to the processor 1100. In some embodiments, if a tag error is absent, data corresponding to a tag may be output to the processor 1100. In some embodiments, if a tag error is present, data corresponding to a tag of a cache DRAM in which the tag error is present and data corresponding to the tag of the cache DRAM in which the tag error is present may be output. Afterwards, in the case of the cache DRAM in which the tag error is present, the tag error may be corrected. After the tag error is corrected, the read operation may be completed.

Figure 25:
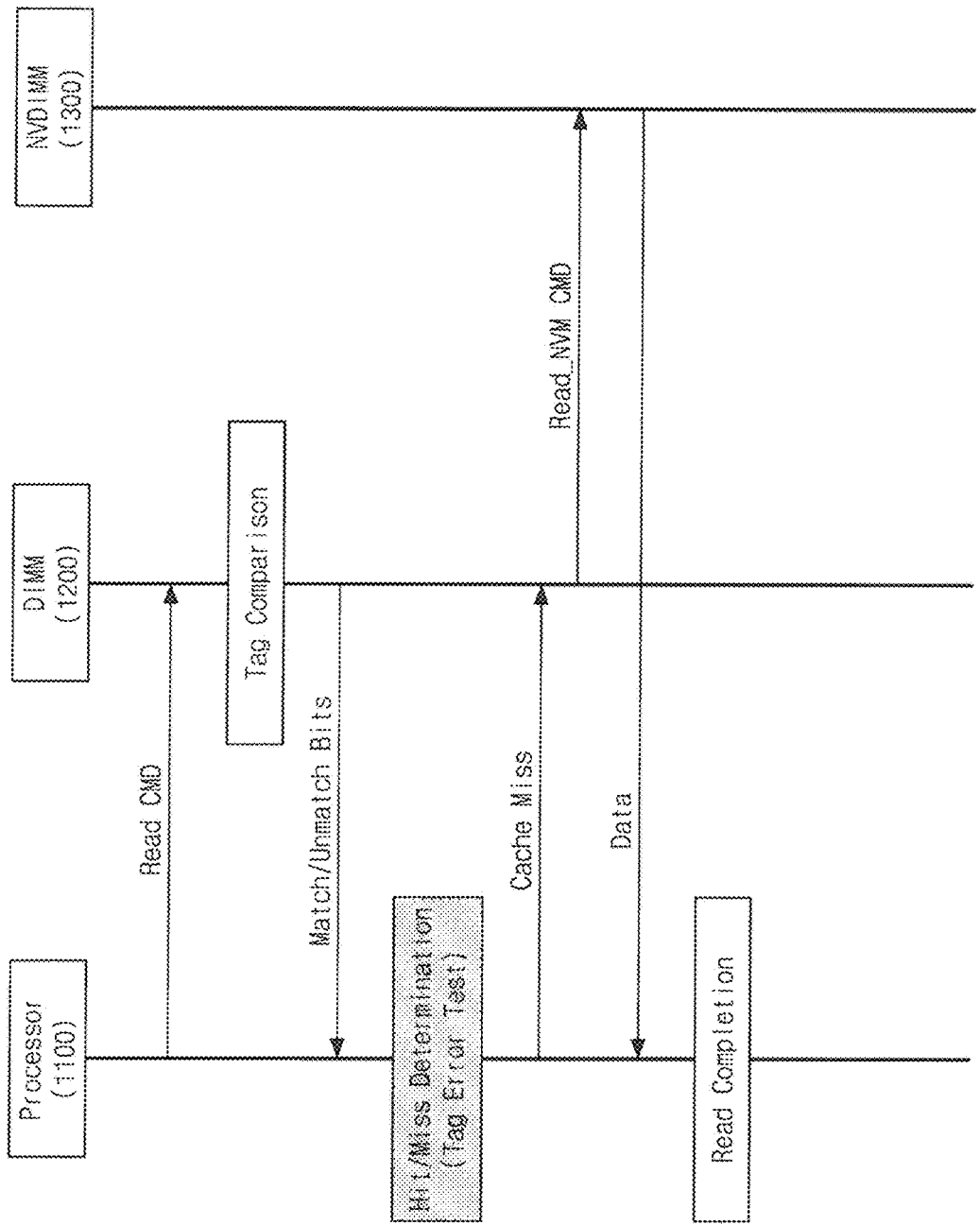
FIG. 25 is a ladder diagram illustrating an example of a read operation of the computing system when a cache miss occurs, according to some embodiments of the inventive concept.

FIG. 25 is a ladder diagram illustrating an example of a read operation of the computing system 1000 when a cache miss occurs, according to some embodiments of the inventive concept. Referring to FIG. 25, a read operation is the same as that of FIG. 24 until the processor 1100 is provided with match/unmatch bits.

The hit/miss determiner 1120 (refer to FIG. 21) of the processor 1100 may determine whether a cache hit/miss occurs based on the majority voting of the match/unmatch bits. The memory module 1200 may receive cache miss information and may send a nonvolatile memory read command Read_NVM CMD to the nonvolatile memory module (NVDIMM) 1300. The nonvolatile memory module 1300 may read data corresponding to the nonvolatile memory read command Read_NVM CMD and the address and may send the read data to the memory module 1200. The memory module 1200 may send data transmitted from the nonvolatile memory module 1300 to the processor 1100. In this case, the memory module 1200 may store a tag and data, which correspond to an address. Afterwards, the read operation may be completed.

Figure 26:
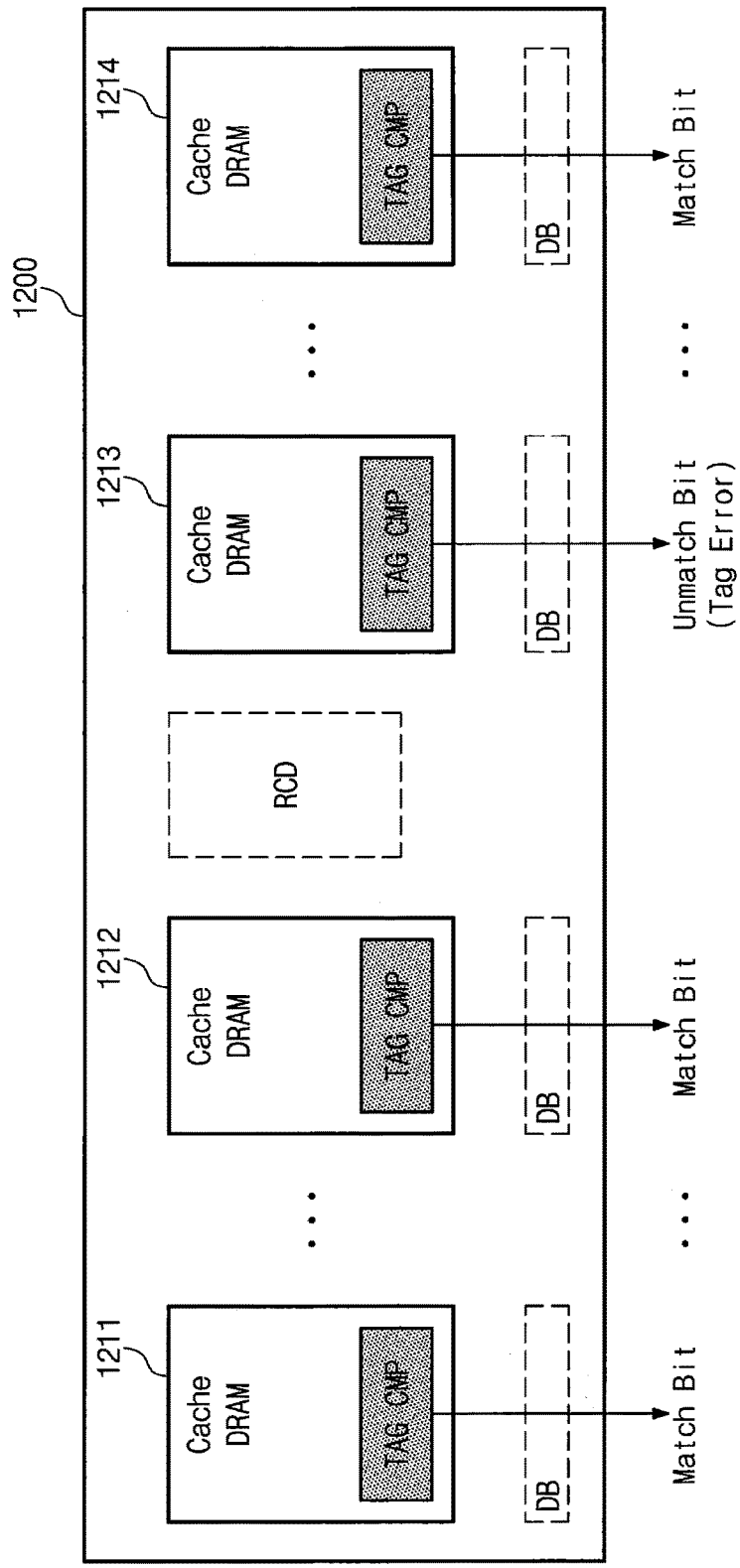
FIG. 26 is a drawing illustrating a method of determining a tag error of the memory module, according to some embodiments of the inventive concept.

FIG. 26 is a drawing illustrating a method of determining a tag error of the memory module 1200, according to some embodiments of the inventive concept. In some embodiments, the cache DRAMs 1211, 1212, 1213, and 1214 store the same tag corresponding to an address upon caching. However, as an operation environment varies, a tag of any one cache DRAM (e.g., 1213) may become different from those of other cache DRAMs (e.g., 1211, 1212, and 1214). That is, the tag of the cache DRAM 1213 may be broken. In this case, as a tag comparison result when a read/write operation is requested, the cache DRAM 1213 may output an unmatch bit, and the remaining cache DRAMs 1211, 1212, and 1214 may output match bits. Here, the match bit and the unmatch bit may be complementary to each other. For example, the match bit may be "1", and the unmatch bit may be "0". Alternatively, the match bit may be "0", and the unmatch bit may be "1". In some embodiments, according to the majority voting, the tag comparison result of the memory module 1200 may indicate a cache hit. Accordingly, it is possible to know that an error is present in the tag of the cache DRAM 1213 outputting an unmatch bit.

Figure 27:
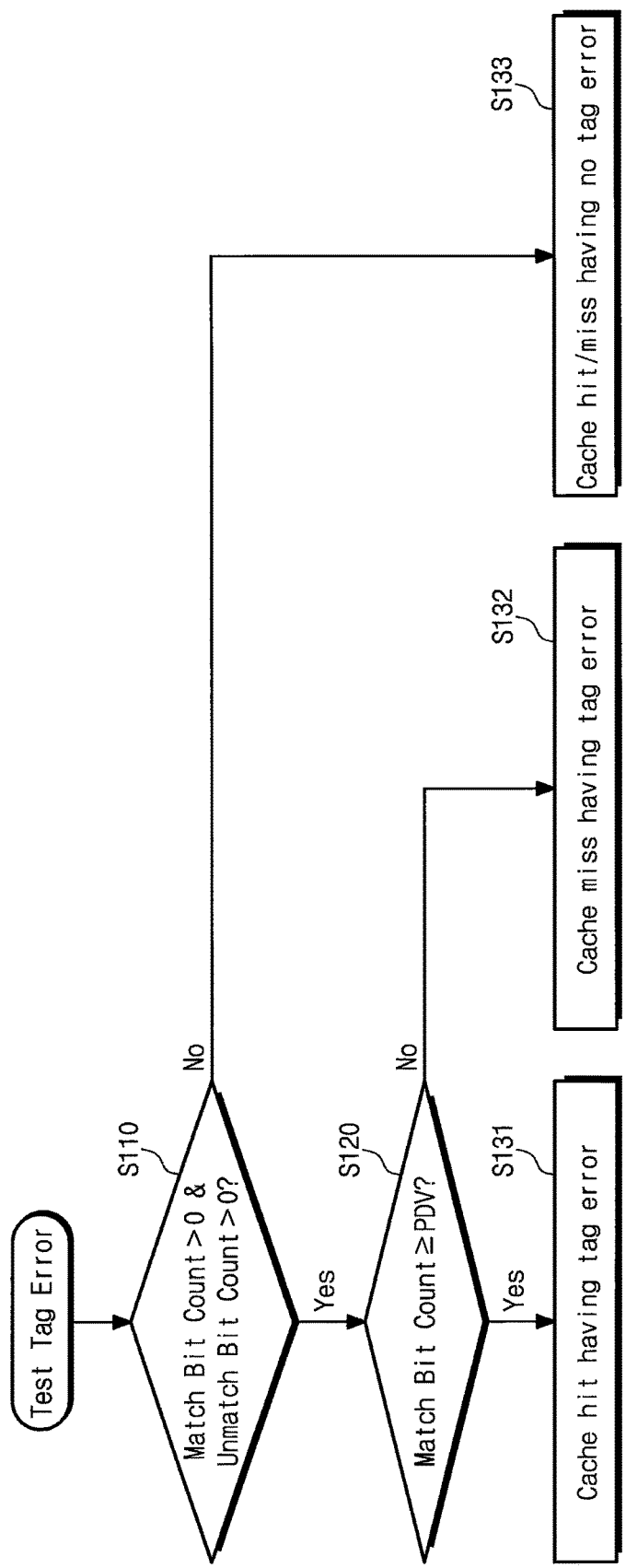
FIG. 27 is a flowchart illustrating a tag error test operation in a computing system, according to some embodiments of the inventive concept.

FIG. 27 is a flowchart illustrating a tag error test operation in a computing system, according to some embodiments of the inventive concept. The process of testing a tag error will be described with reference to FIGS. 21 to 27. The hit/miss determiner 1120 illustrated in FIG. 21 may determine whether a match bit count is greater than "0" and an unmatch bit count is greater than "0" (S110).

If the match bit count is greater than "0" and the unmatch bit count is greater than "0", whether the match bit count is greater than or equal to a predetermined value PDV may be determined (S120). Here, the case that the match bit count is greater than "0" and the unmatch bit count is greater than "0" may correspond to the case that a tag error is present. In some embodiments, the predetermined value PDV may be an integer that is not less than a value corresponding to half the number of cache blocks included in the memory module 1200.

If the match bit count is greater than or equal to the predetermined value PDV, it may be determined that a cache hit having a tag error occurs (S131). If the match bit count is less than the predetermined value PDV, it may be determined that a cache miss having a tag error occurs (S132).

Also, if the match bit count is "0" or the unmatch bit count is "0", it may be determined that a tag error is absent (S133). Accordingly, the cache hit may be determined according to all match/unmatch bits, and the cache miss may be determined according to all unmatch bits.

Figure 28:
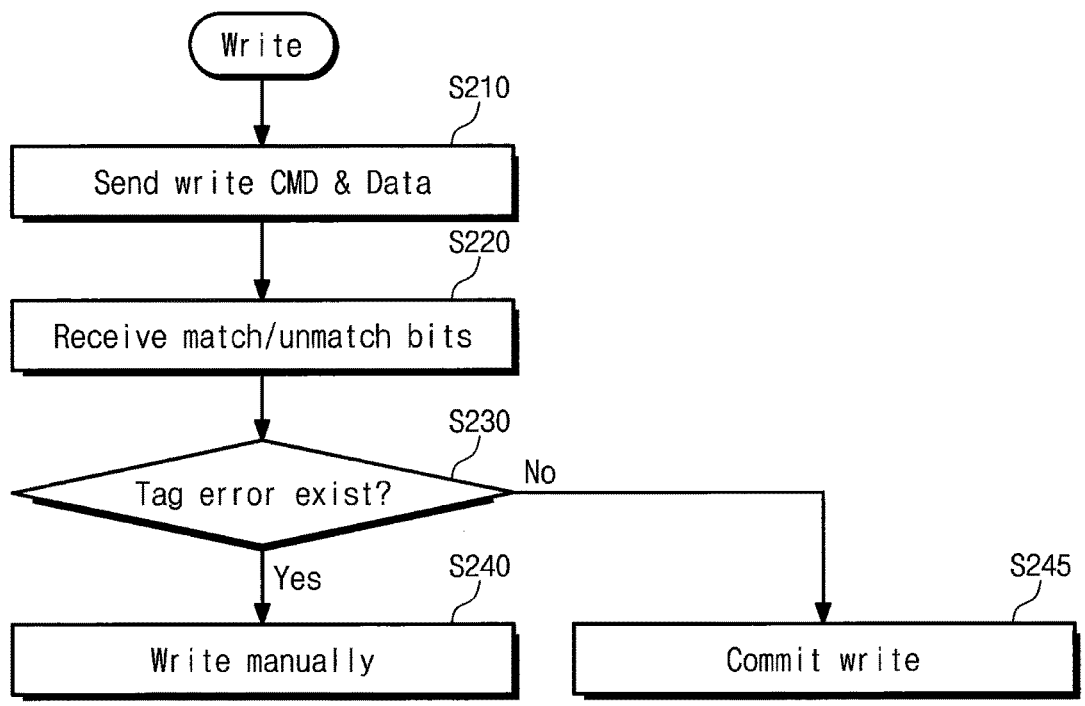
FIG. 28 is a flowchart illustrating a write operation in a processor of a computing system, according to some embodiments of the inventive concept.

FIG. 28 is a flowchart illustrating a write operation in a processor of a computing system, according to some embodiments of the inventive concept. Referring to FIGS. 21 to 28, a write operation of the memory controller 1120 may progress in the processor 1100 of the computing system 1000 as follows.

The memory controller 1120 may send a command CMD, an address, and data for a write operation to the memory module (DIMM) 1200 (S210). Afterwards, the memory controller 1120 may receive match/unmatch bits from the cache blocks 1201 of the memory module 1200, which correspond to the address (S220). Afterwards, whether a tag error test result indicates that a tag error is present may be determined (S230).

If the tag error is present, the write operation may be manually performed. For example, the memory controller 1120 may access a cache block in which a tag error is present, by using information of a cache block in which a tag error is absent, i.e., an absolute address. With this, the corresponding data may be written in the cache block in which a tag error is present (S240). In some embodiments, when the write operation is manually performed, a tag comparator of a cache block in which a tag error is generated may be deactivated. In contrast, if a tag error is absent, the write operation may be committed (or performed) (S245).

Figure 29:
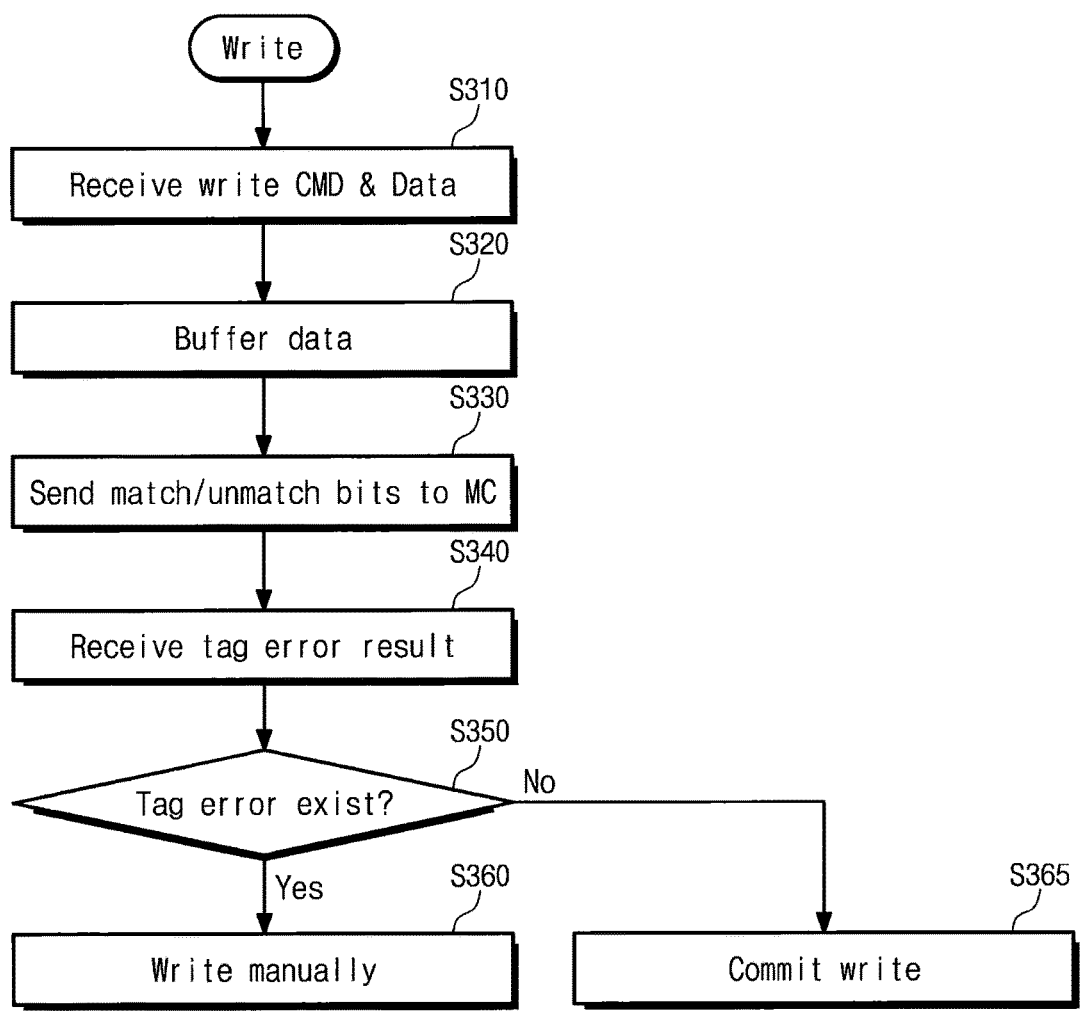
FIG. 29 is a flowchart illustrating an example of a write operation in a memory module of a computing system, according to some embodiments of the inventive concept.

FIG. 29 is a flowchart illustrating an example of a write operation in a memory module of a computing system, according to some embodiments of the inventive concept. Referring to FIGS. 21 to 29, a write operation of the memory module 1200 may progress in the computing system 1000 as follows.

The memory module 1200 may receive a write command, an address, and data from the memory controller 1120 (S310). The write data may be buffered by the data buffer 1211-6 (refer to FIG. 23) (S320). Match/unmatch bits may be sent to the memory controller 1120 as a result of comparing a tag corresponding to the address with a stored tag (S330). Afterwards, a tag error result indicating whether a tag error is present may be received from the memory controller 1120 (S340).

If the tag error is present, the write operation may be manually performed (S360). For example, a write operation may be performed on a cache DRAM at which a tag error is generated, based on a received absolute address or information of a cache DRAM in which a cache hit occurs without a tag error. In this case, a write operation may be performed on buffered write data after recovering the tag error. In contrast, if a tag error is absent, the write operation may be committed (or performed) (S365).

Meanwhile, according to some embodiments of the inventive concept, the memory controller 1120 of the computing system 1000 may further include error correction logic that corrects data errors.

Figure 30:
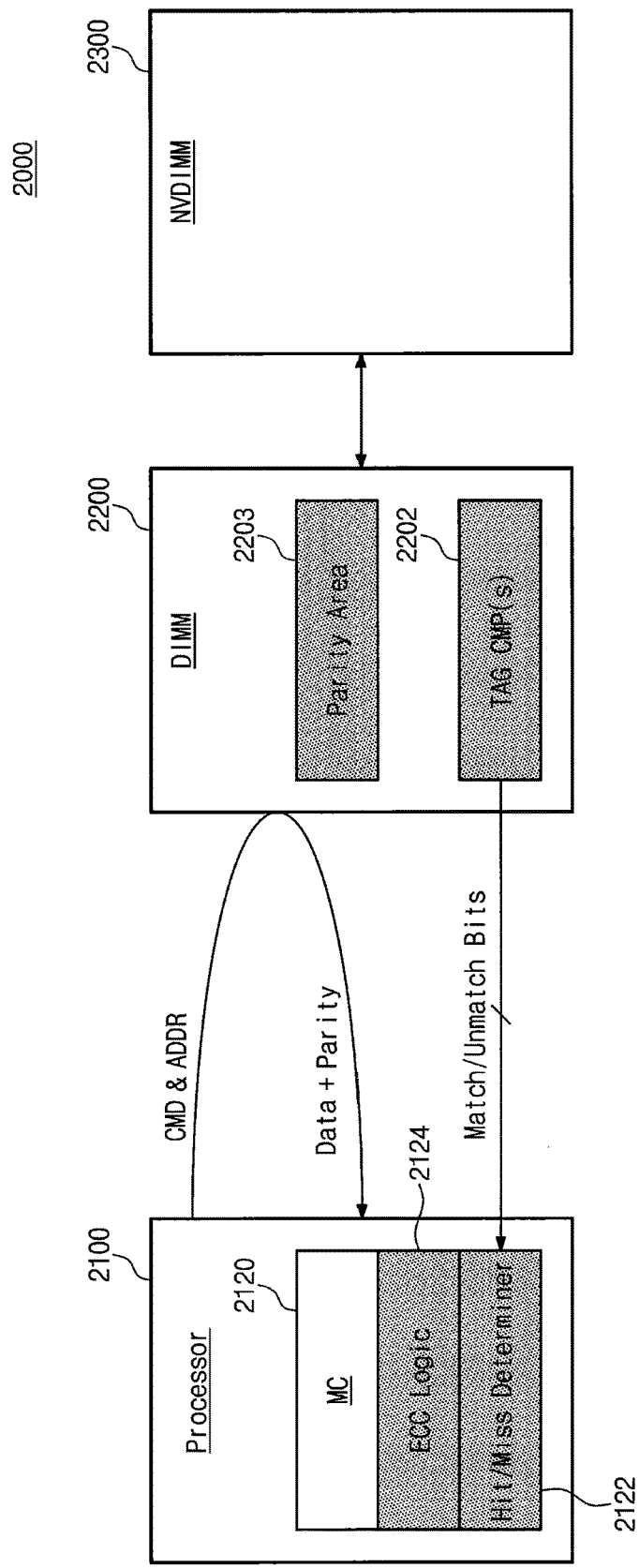
FIG. 30 is a block diagram illustrating a computing system, according to some embodiments of the inventive concept.

FIG. 30 is a block diagram illustrating a computing system 2000, according to another embodiment of the inventive concept. Referring to FIG. 30, the computing system 2000 may include a processor 2100, a memory module (DIMM) 2200, and a nonvolatile memory module (NVDIMM) 2300.

The processor 2100 of FIG. 30 may further include error correction (ECC) logic 2124 as compared with the processor 1100 of FIG. 21. The reaming elements of the process 2100 other than the error correction logic 2124 are the same as those of the processor 1100 of FIG. 21. The error correction logic 2124 may be implemented to correct a data error based on the data and a parity corresponding to the data.

Also, the memory module 2200 illustrated in FIG. 30 may further include a parity area 2203, which stores parities used for error correction, as compared with the memory module 1200 of FIG. 21. The remaining elements of the memory module 2200 other than the parity area 2203 are the same as those of the memory module 1200 of FIG. 21.

Figure 31:
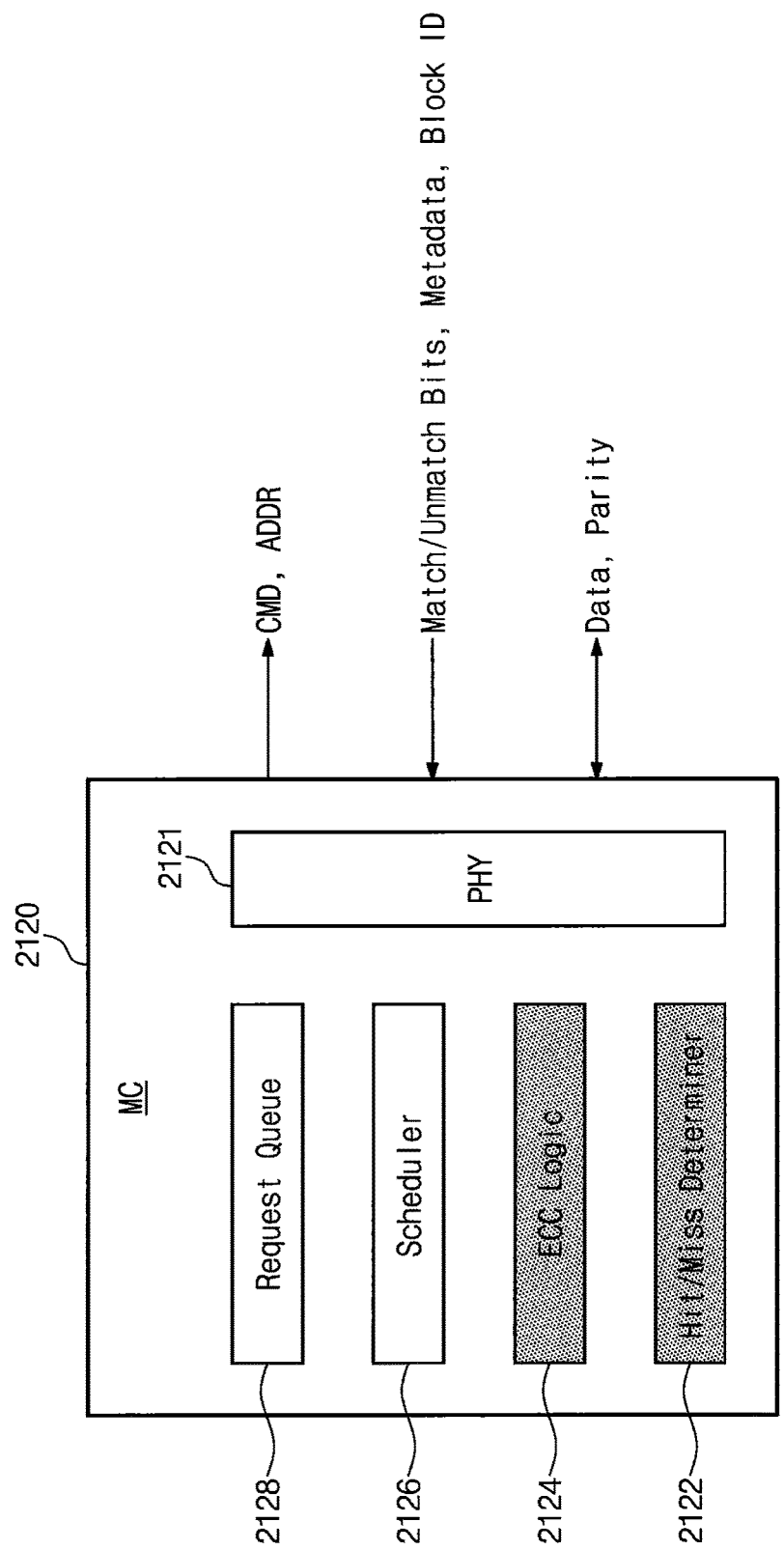
FIG. 31 is a block diagram illustrating the memory controller of FIG. 30 according to some embodiments of the inventive concept.

FIG. 31 is a block diagram illustrating some embodiments of a memory controller 2120 illustrated in FIG. 30. Referring to FIG. 31, the memory controller (MC) 2120 may include an interface circuit (PHY) 2121, a hit/miss determiner 2122, error correction logic 2124, a scheduler 2126, and a request queue 2128.

The interface circuit 2121 may be implemented to communicate with the memory module 2200 over a channel. In some embodiments, the interface circuit 2121 may output a command CMD and an address ADDR, which correspond to a read/write operation, to the memory module 2200.

In some embodiments, the interface circuit 2121 may receive match/unmatch bits, metadata, block identifier information, etc. from the memory module 2200. Here, the match/unmatch bits may be result values of tag comparators in cache blocks. Here, the metadata may be data indicating whether cache data is valid. In some embodiments, the interface circuit 2121 may receive and output data and a parity from and to the memory module 2200.

The hit/miss determiner 2122 may determine a cache hit or a cache miss of the memory module 2200 by using the received match/unmatch bits. At the same time, the hit/miss determiner 2122 may determine whether a tag error is present. The error correction logic 2124 may correct a data error by using the received data and parity. The scheduler 2126 may be implemented to process a plurality of requests based on a predetermined policy. For example, the scheduler 2126 may decide priorities of requests. The request queue 2128 may be implemented to store a read queue or a write queue requested from the processor 2100.

Figure 32:
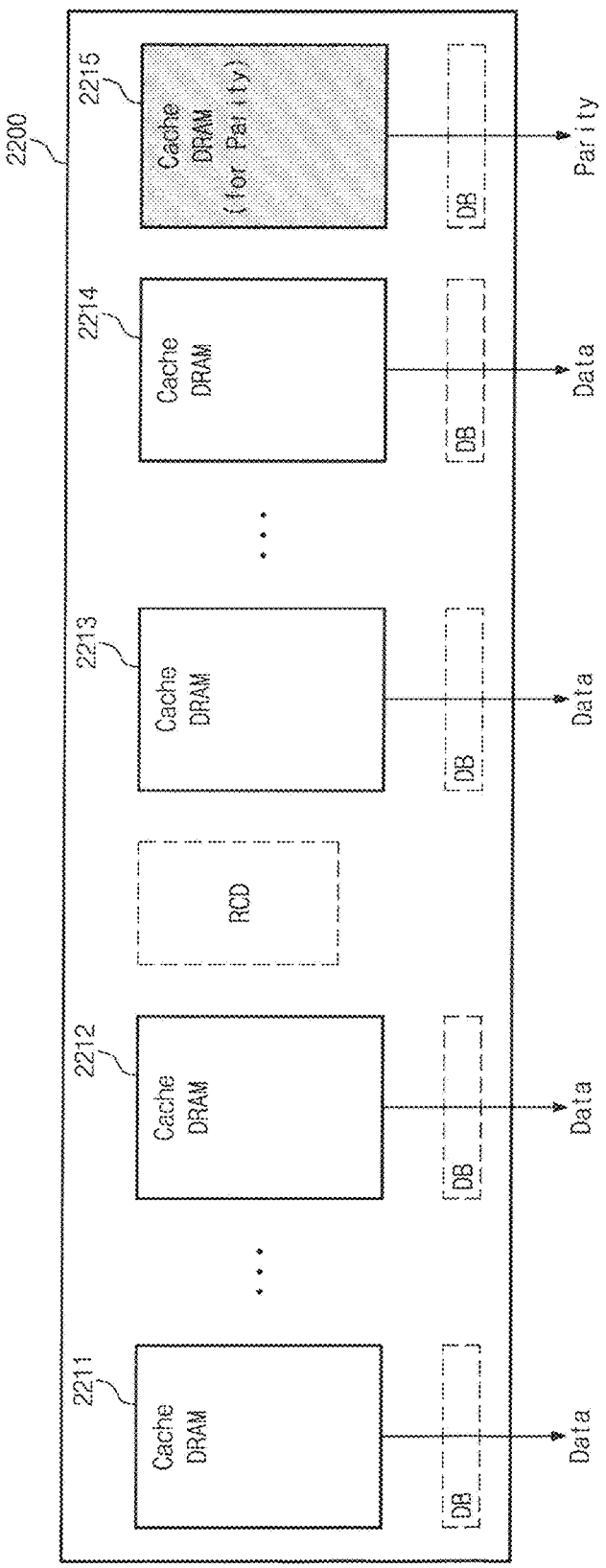
FIG. 32 is a drawing illustrating the memory module of FIG. 30 according to some embodiments of the inventive concept.

FIG. 32 is a drawing illustrating some embodiments of the memory module 2200 illustrated in FIG. 30. Referring to FIG. 32, the memory module 2200 may further include a cache DRAM 2215 for parity as compared with the memory module 1200 of FIG. 22. The remaining elements of the memory module 2200 other than the cache DRAM 2215 are the same as those of the memory module 1200 of FIG. 22.

In some embodiments, the number of data bits of the memory module 2200 may be "64", and the number of parity bits of the memory module 2200 may be "8". However, it should be understood that the number of data bits and the number of parity bits are not limited hereto.

Meanwhile, in FIGS. 1 to 32, the memory controller MC performs an operation of determining a cache hit/miss based on the majority voting of match/unmatch bits. However, embodiments of the inventive concept may not be limited thereto. For example, the operation of determining the cache hit/miss may be performed within a memory module.

Figure 33:
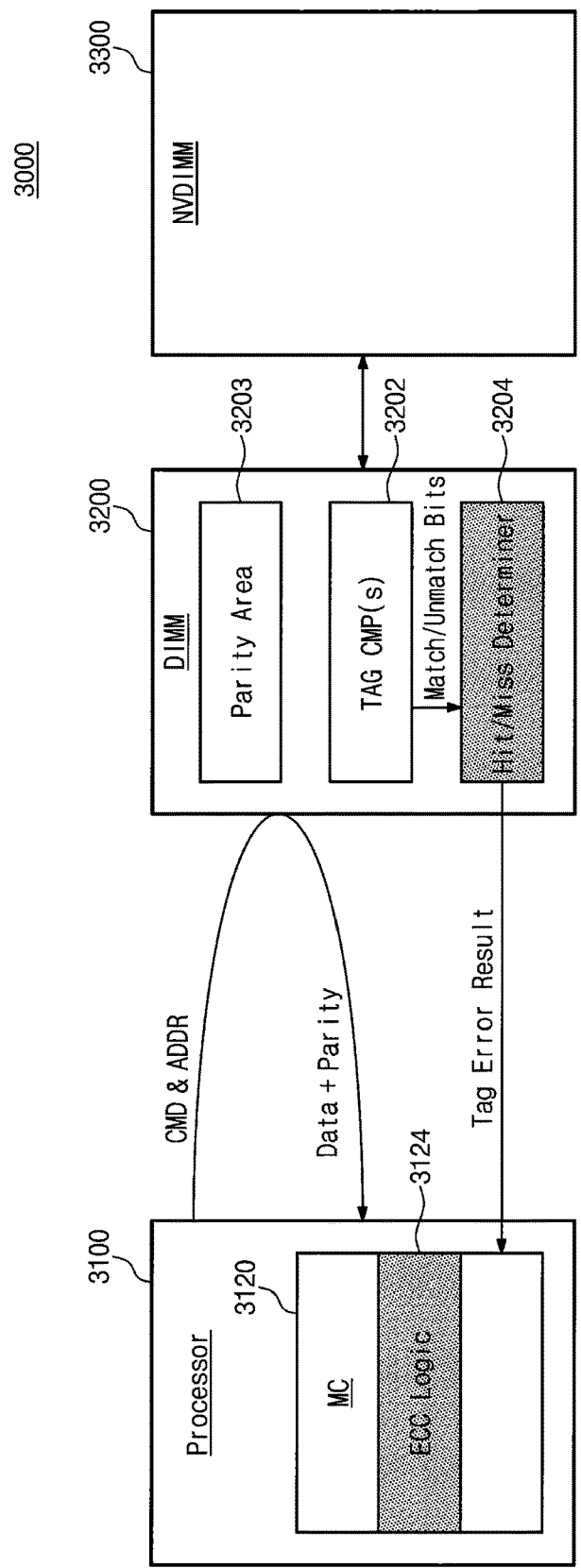
FIG. 33 is a block diagram illustrating a computing system, according to some embodiments of the inventive concept.

FIG. 33 is a block diagram illustrating a computing system 3000, according to another embodiment of the inventive concept. Referring to FIG. 33, the computing system 3000 may be different from the computing system 2000 in that a hit/miss determiner 3204 is included in the memory module 3200. In some embodiments, the hit/miss determiner 3204 may determine whether a cache hit/miss occurs based on the majority voting of the match/unmatch bits. In some embodiments, the hit/miss determiner 3204 may be implemented in the registered connective device RCD illustrated in FIG. 22.

Meanwhile, according to some embodiments of the inventive concept, a computing system may be implemented to have various structures in terms of a memory channel.

FIGS. 34A, 34B, 34C, and 34D are block diagrams illustrating computing systems having various connections with a memory channel.

Figure 34A:
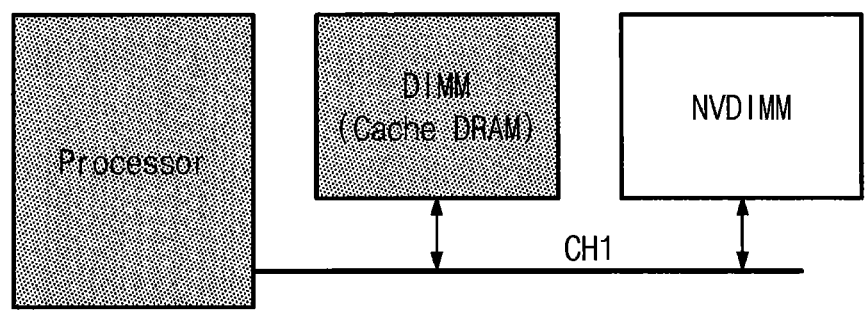
FIGS. 34A, 34B, 34C, and 34D are block diagrams illustrating computing systems having various connections with a memory channel according to some embodiments of the inventive concept.

Referring to FIG. 34A, a processor may be connected to a DIMM (cache DRAM) and a nonvolatile memory module NVDIMM through one memory channel CH1. That is, the memory module DIMM and the nonvolatile memory module NVDIMM may share a memory channel. In some embodiments, even though the memory module DIMM and the nonvolatile memory module NVDIMM are connected to one memory channel CH1, the memory module DIMM and the nonvolatile memory module NVDIMM may be inserted into different slots, respectively.

Figure 34B:
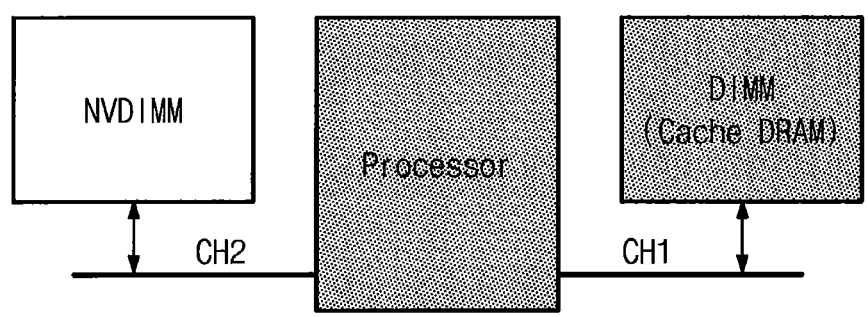

Referring to FIG. 34B, the memory module DIMM may be connected to the processor through a first memory channel CH1, and the nonvolatile memory module NVDIMM may be connected to the processor through a second memory channel CH2 that is different from the first memory channel CH1.

Figure 34C:
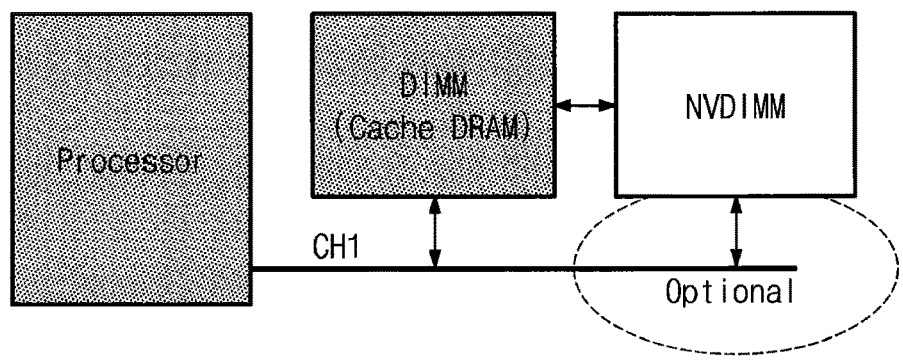

Referring to FIG. 34C, the memory module DIMM may be connected to the processor through a memory channel CH1. In some embodiments, the nonvolatile memory module NVDIMM may be directly connected to the memory module DIMM without using the memory channel CH1. For example, the memory module DIMM may be implemented to have a dual-port. One port may be connected to the memory channel CH1, and the other port may be connected to the nonvolatile memory module NVDIMM.

In some embodiments, the nonvolatile memory module NVDIMM may also connect to the processor through the memory channel CH1.

Figure 34D:
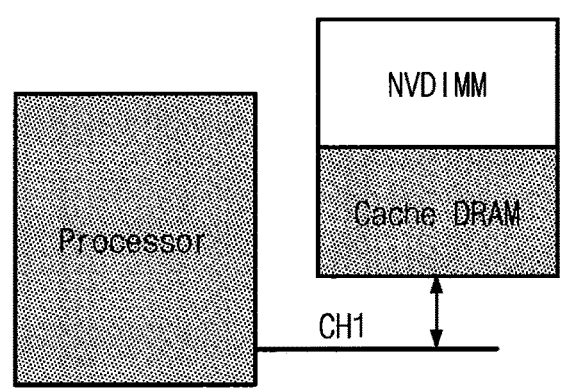

Referring to FIG. 34D, the processor may be connected to the nonvolatile memory module NVDIMM through a memory channel CH1. Here, the nonvolatile memory module NVDIMM may further include a cache DRAM that performs a cache function of the above-described DIMM. In some embodiments, nonvolatile memories may be arranged at a front portion of the nonvolatile memory module NVDIMM, and cache DRAMs may be arranged at a rear portion thereof. In some embodiments, the nonvolatile memory module NVDIMM may be implemented with NVDIMM-P.

Meanwhile, according to some embodiments of the inventive concept, the computing system may further include a nonvolatile memory that is based on a DDR-T (transaction) interface.

However, embodiments of the inventive concept may not be limited thereto. Meanwhile, embodiments of the inventive concept may be applicable to all kinds of computing systems that use a DRAM as a cache of a nonvolatile memory.

The above-described computing system may be described in terms of cache tag recovery. According to some embodiments of the inventive concept, a cache memory device may operate as a set-associative cache. In this case, the cache memory device may compare a plurality of tags and may send a location (e.g., Block ID) of a cache block, in which a cache hit occurs, to a memory controller MC. There is a need to know a location of a cache block in which a cache hit occurs to recover a tag error. To this end, when a cache hit occurs, the cache memory device may send a location (e.g., any one of 0 to 3 in a 4-way set associative cache) of a cache block in which a cache hit occurs to the memory controller MC. The memory controller may again perform a read or write operation on the cache block, in which the hit error is generated, by using a majority voting result and a block location.

According to some embodiments, the cache memory device may include in-memory error correction/detection logic (e.g., in-memory ECC logic) and may store reliability data (e.g., parity, CRC, or checksum). In some embodiments, tags, metadata (e.g., valid bits and dirty bits), and data, which are stored in the cache memory device, may be protected by the reliability data and the in-memory ECC logic.

In general, data may be protected by ECC logic of the memory controller MC together with parity information. However, because tags and metadata are not sent to the memory controller MC together with the data, conventional memory devices may fail to protect the tags and metadata. In contrast, according to some embodiments of the inventive concept, the cache memory device may recover tags and metadata stored in the cache memory device through in-memory error correction/detection.

According to some embodiments, a memory module may store tags and metadata and may perform in-memory tag compare. The memory module may be implemented with a combination of a tag cache memory device and a data cache memory device only storing data.

In some embodiments, a registered connective device RCD of the memory module may receive a tag and a command/address CA from the memory controller MC.

In some embodiments, the tag cache memory device may perform the in-memory tag compare by using the CA and the tag received from the registered connective device RCD and may send, to all data cache memory devices, cache hit/miss information and information indicating whether a cache hit occurs in any block of two cache blocks constituting a set when the cache hit occurs. In some embodiments, the data cache memory device may perform data read and write operations by using information of the tag cache memory device.

In a conventional computing system, reliability data are stored in a memory module, but operations of generating reliability data and checking and recovering a data error by using the reliability data are performed by the memory controller MC. However, because tags and metadata stored in the cache memory device are not sent to the memory controller MC during a read operation, a conventional computing system may fail to recover an error generated in the tags and metadata.

In contrast, according to some embodiments of the inventive concept, the in-memory ECC logic for protecting metadata may be implemented in the cache memory device of the computing system, and the computing system may store reliability data through the configuration. In some embodiments, the tag cache memory device may perform recovery when a correctable error is generated and may send error occurrence information to the memory controller MC when an uncorrectable error is generated.

According to another embodiment, a memory module may be implemented with a tag cache memory device that stores tags and metadata and performs in-memory tag compare. In some embodiments, the cache memory device may store tags, metadata, and data. In some embodiments, the cache memory device may write or read data by automatically performing the in-memory tag compare by using a command/address CA and a tag received from a registered connective device RCD.

In some embodiments, an error that is generated in a tag may be detected by performing majority voting on cache hit/miss information of each cache memory device. Here, a threshold value for the majority voting may be set. For example, in a memory module composed of 17 (16 Data+1 Parity) cache memory devices, when the memory controller MC receives cache hit signals from eight or more cache memory devices, the majority voting result may indicate a cache hit. In this case, when a cache memory device sending a cache miss signal is present, the memory controller MC may recover a tag error by accessing the cache memory device sending the cache miss signal by using an absolute address.

In some embodiments, the majority voting may also be used to check and recover an error of metadata such as valid bits and dirty bits.

In another embodiment, the majority voting may be performed in the registered connective device RCD and only information indicating whether an error is generated may be sent to the memory controller MC.

According to some embodiments of the inventive concept, the cache memory device may provide an in-memory ECC function. In this case, error detection and recovery may be performed on metadata as well as tags. If the majority voting function is absent in the cache memory device, a correctable error may be recovered; when an uncorrectable error is generated, error occurrence information may be sent to the memory controller MC.

According to another embodiment of the inventive concept, the cache memory device may provide the in-memory ECC function and the majority voting function. In this case, the reliability of system may be further improved by performing the majority voting on an error that is uncorrectable through in-memory ECC.

Meanwhile, when a write miss is determined as a write hit due to a tag error, data may be stored in an abnormal location, thereby causing a system error. According to some embodiments of the inventive concept, cache memory devices of the memory module may buffer write data and may commit a write operation when receiving a signal, which indicates that an error is absent, from the memory controller MC.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of a computing system that comprises at least one nonvolatile memory, a memory module performing a cache function of the nonvolatile memory and comprising cache dynamic random access memories (DRAMs), and a processor controlling the nonvolatile memory and the memory module, the method comprising:
    outputting, at the processor, a command and an address to the memory module;
    receiving match/unmatch bits indicating results of comparing a tag corresponding to the address with tags stored in the cache DRAMs of the memory module, from the memory module;
    determining, at the processor, a cache hit/miss from the match/unmatch bits by using majority voting; and
    outputting, at the processor, the determined cache hit/miss to the memory module.

2. The method of claim 1, wherein the command is a read command,
    the method further comprising:
    receiving, at the processor, data from the memory module when the cache hit/miss information indicates a cache hit.

3. The method of claim 1, wherein the command is a read command, and
    the method further comprising:
    reading data from the nonvolatile memory based on the address when the cache hit/miss information indicates a cache miss; and
    receiving, at the processor, the read data through the memory module.

4. The method of claim 1,
    wherein each of the cache DRAMs comprises a tag comparator that compares a tag corresponding to the address and a stored tag and outputs a match/unmatch bit in response to the comparison.

5. The method of claim 4, further comprising:
    determining whether a match bit count associated with the match/unmatch bits is greater than "0" and an unmatch bit count associated with the match/unmatch bits is greater than "0";
    determining that a tag error is absent, when the match bit count is "0" or the unmatch bit count is "0"; and determining that a tag error is present, when the match bit count is greater than "0" and the unmatch bit count is greater than "0".

6. The method of claim 5, further comprising:
accessing a first one of the cache DRAMs, in which a tag error is present, in a write operation or a read operation by using location information of a second one of the cache DRAMs in which a tag error is absent.

7. The method of claim 5, further comprising:
correcting a tag error of a first one of the cache DRAMs, in which the tag error is present, by using location information and a parity of a second one of the cache DRAMs in which a tag error is absent.

8. The method of claim 7, further comprising:
buffering, at the memory module, data in a write operation until a tag error is detected and corrected; and
writing the buffered data after the tag error is corrected.

9. A tag error test method of a computing system that comprises at least one nonvolatile memory, a memory module performing a cache function of the nonvolatile memory, and a processor controlling the nonvolatile memory and the memory module, the method comprising:
generating, at each of a plurality of cache DRAMs of the memory module, a match/unmatch bit as a result of comparing a tag corresponding to an address and a tag stored in a respective one of the plurality of cache DRAMs;
determining whether a match bit count is greater than "0" and an unmatch bit count is greater than "0"; and
determining a cache hit/miss from the match/unmatch bits through majority voting when the match bit count is greater than "0" and the unmatch bit count is greater than "0".

10. The method of claim 9, further comprising:
determining, at a memory controller of the processor, whether the match bit count is greater than "0" and the unmatch bit count is greater than "0".

11. The method of claim 9, further comprising:
determining, at the memory module, whether the match bit count is greater than "0" and the unmatch bit count is greater than "0".

12. The method of claim 9, further comprising:
determining that a tag error is absent when the match bit count is "0" or the unmatch bit count is "0".

13. The method of claim 9, further comprising:
determining that a tag error is present when the match bit count is greater than "0" and the unmatch bit count is greater than "0"; and
correcting, when the tag error is present, an error of the tag stored in one of the plurality of cache DRAMs in which the tag error is present by using location information of a second one of the plurality of cache DRAMs in which a tag error is absent.

14. A method, comprising:
receiving a command and an address at a cache memory module, the cache memory module comprising a plurality of cache memory blocks;
determining cache hit/miss information based on an input tag associated with the address and a plurality of tags stored in the plurality of cache memory blocks, respectively;
determining that one of the plurality of tags is in error due to being different than other ones of the plurality of tags;
determining whether the one of the plurality of tags that is different is correctable; and
correcting the one of the plurality of tags that is different from the other ones of the plurality of tags at the cache memory module when the one of the plurality of tags that is different is determined to be correctable.

15. The method of claim 14, further comprising:
sending information to a memory controller indicating that the one of the plurality of tags was determined not to be correctable.

16. The method of claim 14, wherein each of the plurality of cache memory blocks are configured to store metadata indicating whether cache data stored therein are valid; and
wherein the method further comprises:
determining that the metadata in one of the plurality of cache memory blocks contains an error; and
correcting the error in the metadata in the one of the plurality of cache memory blocks at the cache memory device.

17. The method of claim 16, wherein each of the plurality of cache memory blocks are configured to store parity information associated with the respective metadata and parity information associated with respective ones of the plurality of tags;
wherein correcting the one of the plurality of tags comprises correcting the one of the plurality of tags using the respective parity information associated with the one of the plurality of tags; and
wherein correcting the error in the metadata comprises correcting the error in the metadata in the one of the plurality of cache memory blocks using the respective parity information associated with the metadata in the one of the plurality of cache memory blocks.

18. The method of claim 14, further comprising:
accessing the one of the plurality of cache memory blocks that stores the one of the plurality of tags that is different based on location information obtained from another one of the plurality of cache memory blocks.

19. The method of claim 14, wherein the cache memory module comprises a registered connective device; and
wherein receiving the command and the address at the cache memory module comprises receiving the command and the address at the registered connective device.

20. The method of claim 19, further comprising:
controlling the one of the plurality of cache memory blocks that stores the one of the plurality of tags that is different based on a predetermined policy using the registered connective device.

* * * * *